(12) United States Patent
Hatai

(10) Patent No.: US 7,704,652 B2
(45) Date of Patent: Apr. 27, 2010

(54) EXPOSURE OPERATION EVALUATION METHOD FOR EXPOSURE APPARATUS AND MANUFACTURING METHOD FOR SEMICONDUCTOR DEVICE

(75) Inventor: Tetsuya Hatai, Hukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 561 days.

(21) Appl. No.: 11/502,771

(22) Filed: Aug. 11, 2006

(65) Prior Publication Data

US 2007/0064211 A1   Mar. 22, 2007

(30) Foreign Application Priority Data

Aug. 29, 2005   (JP)   ............... 2005-248447

(51) Int. Cl.
*G03F 9/00*   (2006.01)
(52) U.S. Cl. .......................... 430/22; 430/30
(58) Field of Classification Search .................. 430/22, 430/30
See application file for complete search history.

(56) References Cited

U.S. PATENT DOCUMENTS 6,699,627 B2 *   3/2004   Smith et al. .................. 430/22

FOREIGN PATENT DOCUMENTS

| JP | 11-186155 | 7/1999 |
| JP | 11-195596 | 7/1999 |
| JP | 2001-015419 | 1/2001 |
| KR | 1996-0002287 | 2/1996 |

OTHER PUBLICATIONS

English-language translation of Korean Office Action mailed on Oct. 24, 2007.

* cited by examiner

*Primary Examiner*—Christopher G Young
(74) *Attorney, Agent, or Firm*—David G. Conlin; Steven M. Jensen; Edwards Angell Palmer & Dodge LLP

(57) ABSTRACT

An exposure operation evaluation method for an exposure apparatus for arranging a predetermined number of at least one evaluation pattern in an overlapping area and printing the at least one evaluation pattern on a substrate when performing a plurality of exposures and printing on the substrate while sequentially step-moving an exposure area in quadrangle, the exposure area having evaluation patterns arranged on an outer peripheral side of a circuit pattern, the overlapping area overlapping respective exposure areas adjacent to four sides of the exposure area, the method including: measuring a printing misalignment between each evaluation pattern of adjacent exposure areas printed on the substrate; and calculating a plurality of linear components in an exposure operation of the exposure apparatus based on the result of the measurement of the printing misalignment and suppressing and controlling the printing misalignment based on the plurality of linear components.

30 Claims, 9 Drawing Sheets

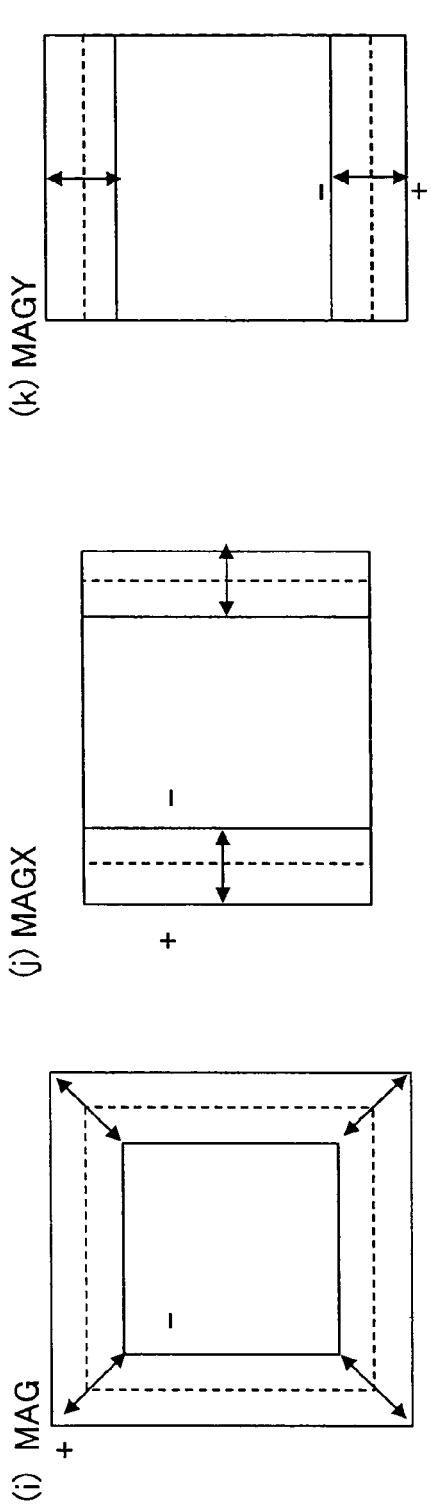
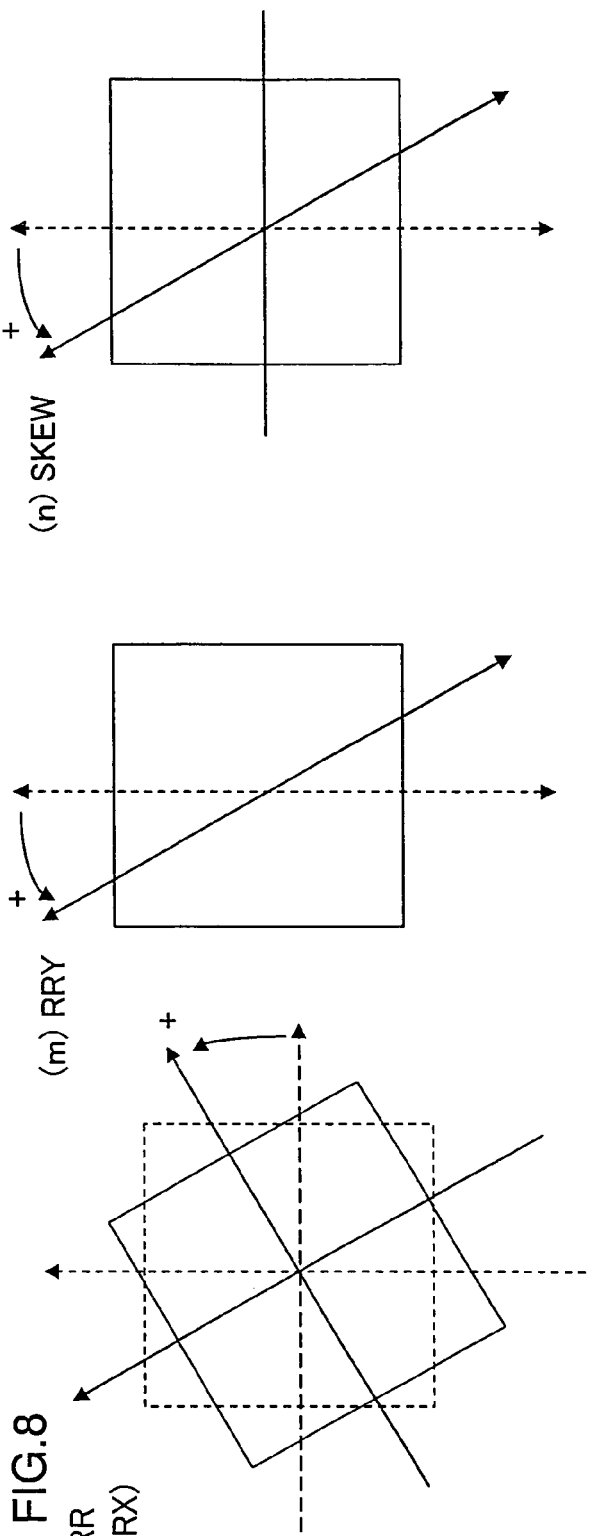
FIG.7
FIG.8

EXPOSURE OPERATION EVALUATION METHOD FOR EXPOSURE APPARATUS AND MANUFACTURING METHOD FOR SEMICONDUCTOR DEVICE

This Nonprovisional application claims priority under 35 U.S.C. §119(a) on Patent Application No. 2005-248447 filed in Japan on Aug. 29, 2005, the entire contents of which are hereby incorporated by reference.

BACKGROUND OF THE INVENTION

1. Field of the Invention

The present invention relates to: an exposure operation evaluation method for an exposure apparatus for adjusting and controlling an exposure operation by measuring a printing result of a predetermined evaluation pattern which has been printed on a substrate by the exposure operation; and a manufacturing method for semiconductor device for manufacturing a semiconductor device by using the adjusted and controlled exposure apparatus based on the evaluation result obtained by the exposure operation evaluation method for the exposure apparatus.

2. Description of the Related Art

When factories for manufacturing semiconductor elements (e.g., ultra large scale integrated circuit) form a pattern (e.g., circuit pattern) on a substrate, they mainly print on the substrate the pattern (e.g., circuit pattern), which has been drawn on a reticle, by using a reduced projection exposure apparatus through a projection lens, perform a step of forming the pattern such as the circuit pattern on the substrate a plurality of times so as to manufacture a semiconductor element in a laminated structure on the substrate. This exposure step has been increasingly performed by using exposure apparatuses, which have different accuracy from each other, for an exposure step in each different manufacturing step during the process of manufacturing one type of semiconductor device in consideration of processing accuracy and manufacturing cost of each pattern to be formed.

For example, for each semiconductor device, formed according to a new generation rule, with its processing line width being reduced, process construction of all layers for a semiconductor element to be manufactured by newly utilizing exposure apparatuses whose accuracy has been improved in each factor does not satisfy the manufacturing cost. Thus, a combination of exposure apparatuses which were used in each generation before the previous generation and new exposure apparatuses which can achieve a required new technique with excellent accuracy is often used to construct a process which achieves a rule for a new generation. Accordingly, in a process of manufacturing one type of a semiconductor device, exposure apparatuses with different functions and performance from each other have been increasingly used for the exposure process of each processed layer.

For exposure apparatuses in each generation, in order to obtain the resolution which is required in each generation along with the miniaturization of a circuit pattern, exposure light is caused to be short-wavelengthened. As exposure light which has been short-wavelengthened, for example, i ray (wavelength 365 nm) from mercury lamp, KrF excimer laser (wavelength 248 nm), ArF excimer laser (wavelength 193 nm) have been put into practice, and exposure apparatuses which use further short-wavelengthened F2 (wavelength 157 nm) excimer laser, electronic beam drawing technology, EUV (wavelength 13 nm) light and the like have been pursued.

When a pattern (e.g. circuit pattern) on a reticle is reduced-projected onto a substrate by using the light source thereof, in exposure apparatuses (e.g., full-field-type (stepper) and scanning-type (scanner) which have been used in each generation), a processing technique and a lens material for a reduced projection lens, a table driving control accuracy, an exposure method, an exposure field area, a reduced projection magnification, an alignment accuracy and the like are different between each exposure apparatus.

When each layer is formed, for example, a structure is being established such that exposure in each step is performed using the following so-called mix and match method: (i) a scanning-type reduced projection exposure apparatus (scanner) is used for exposure of a critical layer which requires high alignment accuracy; (ii) a full-field-type reduced projection exposure apparatus (stepper), which has been used for the critical layer in the previous generation, is used for exposure of a sub-critical layer which does not require the alignment accuracy as high as that for the critical layer but requires a certain degree of alignment accuracy; and (iii) a full-field-type reduced projection exposure apparatus (stepper), which was used in the generations before the previous generation, or a full-field-type reduced projection exposure apparatus (stepper), which has a low-reduced magnification and is intended for improving the throughput, is used for exposure of a rough layer.

When a first layer is exposed to light on a semiconductor substrate, accuracy relating to alignment of a printed pattern is not normally measured. This is because it is considered that a variety of accuracy of the exposure apparatus, for example, stage stepping accuracy, reduced projection magnification control accuracy, reticle rotation accuracy, shot alignment accuracy, distortion, stage synchronization accuracy between an original plate and a substrate by the scanning-type reduced projection exposure apparatus (scanner) and the like are regularly measured, managed and corrected, and the results which are used in an allowable range are reflected.

Additionally, when the exposure apparatus for the first layer is the full-field-type reduced projection exposure apparatus (stepper) and the exposure apparatus for the second layer and its subsequent layers is the scanning-type reduced projection exposure apparatus (scanner), and the result of alignment for the second layer is to be improved, then the number of items of linear components to be corrected which can be corrected by the scanning-type reduced projection exposure apparatus (scanner) is the same as that by the full-field-type reduced projection exposure apparatus (stepper) and furthermore there are other items to be corrected other than them. Therefore, correction can be performed with high accuracy. Alternatively, as another example, when the exposure apparatus for the first layer is the full-field-type reduced projection exposure apparatus (stepper) and the exposure apparatus for the second layer and its subsequent layers is also the full-field-type reduced projection exposure apparatus (stepper), then it is possible to improve the alignment result by conducting a setting (grouping) of an exposure apparatus group in which each exposure apparatus has a similar misalignment tendency for distortion to each other.

Reference 1 discloses a technology that the position of a destroyed pattern image such as in thin line portion is obtained as a printed error of an evaluation pattern which has been printed on a substrate (wafer) while moving (scanning) an original plate (reticle) and the substrate in synchronization by using the scanning-type reduced projection exposure apparatus (scanner) so as to evaluate the exposure operation with excellent accuracy at high speed. Based on this evaluation result, an exposure condition of the scanning-type reduced projection exposure apparatus (scanner) is evaluated, and the evaluation result is then fed back in order to adjust and control the scanning-type reduced projection exposure apparatus (scanner).

Reference 2 discloses an alignment and exposure method for calculating the position of a particular exposure area (hereinafter, referred to as "shot") among shots, which have been printed on a substrate (wafer), relative to other shots by employing a mix and match method for exposing mask patterns one above another on the substrate by using two exposure apparatuses in which exposure field sizes are different from each other. According to this technology, deformation in the wafer and deformation in the shot can be learned with the minimum number of alignment, and the alignment between an upper layer and a lower layer can be improved, thereby being able to improve the throughput of the exposure.

[Reference 1] Japanese Laid-Open Publication No. 11-186155

[Reference 2] Japanese Laid-Open Publication No. 11-195596

SUMMARY OF THE INVENTION

However, when a first layer is exposed to light, accuracy relating to alignment of a printed pattern is not normally measured. Thus, when the exposure apparatus for the first layer is the scanning-type reduced projection exposure apparatus (scanner), and the position for the first layer is misaligned due to correctable items of linear components, (the items being inherent to the scanning-type reduced projection exposure apparatus (scanner), other than the items of linear components to be corrected which can be corrected by the full-field-type reduced projection exposure apparatus (stepper)), with respect to an ideal position to be printed on the substrate or due to an operation error and the like, it is difficult to correct the position which has been misaligned by the scanning-type reduced projection exposure apparatus (scanner) when the exposure apparatus for the second layer and its subsequent layers is the full-field-type reduced projection exposure apparatus (stepper), thereby aggravating the result of alignment.

In this case, in contrast to the layer formed by using the first scanning-type reduced projection exposure apparatus (scanner), in the layer formed by using the second full-field-type reduced projection exposure apparatus (stepper), unlike those in the layer formed by the first scanning-type reduced projection exposure apparatus (scanner), items of linear components to be corrected (e.g., shot scaling component in a shot in a direction parallel to a scanning direction and orthogonal-degree component in the shot) at the time of reduced-projection can not be corrected, and therefore this will be a cause for aggravating the overlapping accuracy of layers formed by using the second full-field-type reduced projection exposure apparatus (stepper).

In an exposure method using a conventional mix and match method, in order to reduce the amount of rework processing (i.e., processing that after a resist film on a substrate on which a circuit pattern on a reticle is printed is separated by $O_2$ plasma processing, and again the resist film is formed by a resist application machine and is exposed to light) which is performed when misalignment is out of an allowable value for the misalignment, alignment method needs to be considered when layers one over another are exposed to light (e.g., easing allowable value of overlapping accuracy in a manufacturing step in which the second full-field-type reduced projection exposure apparatus (stepper) is used, reducing a variety of accuracy allowable range for the apparatus and shortening a checking period for the apparatus accuracy in order to perform the correction for maintaining the reduced allowable value.

However, in the exposure method and apparatus management technology using the conventional mix and match method described above, there are concerns, for effective utilization of existing apparatuses for the objective of the cost reduction, such as: the reduction of the number of chips which can be mounted on a substrate due to the increase of the chip size along with the easing of the alignment allowable value; the increase of the number of the items to be steadily managed for the apparatus and of the inspection time; and the increase of the cost due to the increase of the number of rework processing in each forming step.

Accordingly, unless the accuracy for the first layer is not sufficiently controlled, this will have an affect on the alignment on the second layer and its subsequent layers. In other words, when each layer is formed using the mix and match method in which a lower layer is exposed to light by using the scanning-type reduced projection exposure apparatus (scanner) and an upper layer is exposed to light by using the full-field-type reduced projection exposure apparatus (stepper), the first layer must be exposed to light with excellent accuracy in order to improve the alignment accuracy between the lower layer and the upper layer.

As a conventional technique for controlling the first layer with excellent accuracy, Reference 1 evaluates an exposure condition (damage of a pattern image) performed by the scanning-type reduced projection exposure apparatus (scanner) and corrects and controls the scanning-type reduced projection exposure apparatus (scanner) based on the exposure condition. However, a reticle for evaluation which is used as an original plate is a reticle for test exclusive use, wherein a plurality of evaluation patterns for evaluating a degree of exposure almost entirely covers the reticle for test exclusive use. Thus, an evaluation step for evaluating an exposure operation (exposure condition) and a manufacturing step of manufacturing a semiconductor device are totally separate, thereby moving away from reducing the number of manufacturing-hours and reducing the cost of manufacturing. Furthermore, this evaluation method is for the exposure condition (damage of a patterned image), and Reference 1 does not mention the improvement of alignment between each layer which is manufactured by using this evaluation method. Yet further, this evaluation method is not for adjusting and controlling the position of the first layer with excellent accuracy by the scanning-type reduced projection exposure apparatus (scanner) for the subsequent second layer.

Reference 2 discloses forming a circuit pattern as well as a plurality of alignment marks in a pattern area of an original plate (reticle) and simultaneously printing these patterns on a first layer on a wafer. However, the alignment marks printed on the first layer are merely provided for alignment with a second layer, and regarding the evaluation for a shot misalignment itself due to a step movement by the exposure apparatus, shot misalignment is calculated by using central coordinates of the shot as a new parameter. In this case, although the misalignment to be corrected between the central coordinates can be obtained, it can not be determined whether the misalignment has resulted from a transfer pitch or it includes a rotation. Yet still, the position of the first layer with excellent accuracy for the subsequent second layer cannot be adjusted and controlled by the scanning-type reduced projection exposure apparatus (scanner).

Herein, an accuracy checking technique using the scanning-type reduced projection exposure apparatus (scanner) will be examined with reference to FIG. 11.

This single scanning-type reduced projection exposure apparatus (scanner) is provided. When the apparatus is launched by a manufacturer or after the apparatus is delivered to a user, exposure operation evaluations as in the following can be regularly performed by the user when a stability evaluation is performed in order to check the accuracy of the apparatus.

FIG. 11(a) is a plain view showing an arrangement state of each exposure area (shot) which has been sequentially printed on the wafer by using the scanning-type reduced projection exposure apparatus (scanner). In FIG. 11(a), rectangles represented with broken lines are borders for each shot. The edge area of each of four outer peripheral sides of each shot having a shape of quadrangle in FIG. 11(a) is exposed to light overlapping an edge area of an adjacent area. If an inspection mark is formed on this overlapping area of the shots, misalignment with the inspection mark of the adjacent shot can be measured.

FIG. 11(b) is a view showing an arrangement of inspection marks for evaluating a stage-stepping accuracy. Three measurement points are provided on each side in longitudinal direction and lateral direction. Linear components resulting from the measurement are corrected and the variation of a re-calculation result is evaluated. For example, the misalignment between a black circle ● and a white circle ○ is measured, and 3 σ (non-linear components) is calculated based on the measurement result of the black circle ● and the white circle ○ after the linear components are removed, and the stepping (operation) variation of the stage is evaluated. The black circle ● and the white circle ○ are for calculating the misalignment in the Y direction and in the X direction, respectively.

FIG. 11(c) is a view showing an arrangement of inspection marks for evaluating reticle rotation accuracy. Misalignment of these marks is measured, and thus the rotation of a shot can be measured. Three measurement points are provided on one side in the Y direction, and the linear components in a rotating direction is calculated.

However, in the accuracy checking technique using such a single scanning-type reduced projection exposure apparatus (scanner), one inspection mark provided for accuracy checking is only used for checking one particular type of accuracy (stage-stepping accuracy in the X direction or the Y direction or reticle rotation accuracy). Therefore, there exists a problem with which man-hours are significantly increased in order to perform a large number of types of accuracy checking one by one.

The present invention intends to solve the problems described above. The objective of the present invention is to provide: an exposure operation evaluation method for an exposure apparatus which is capable of comprehensively and collectively performing a number of types of accuracy checking for the first layer or a halfway layer by detecting and evaluating a printing misalignment between each step adjacent shot using the scanning-type reduced projection exposure apparatus (scanner), simplifying steps for manufacturing a semiconductor device, and adjusting and controlling the position of the first layer or the halfway layer for a subsequent second layer or a layer after the halfway layer with excellent accuracy; and a manufacturing method for semiconductor device for manufacturing a semiconductor device by using the exposure operation evaluation method for the exposure apparatus.

An exposure operation evaluation method for an exposure apparatus according to the present invention for arranging a predetermined number of at least one evaluation pattern in an overlapping area and printing the at least one evaluation pattern on a substrate when performing a plurality of exposures and printing on the substrate while sequentially step-moving an exposure area in quadrangle, the exposure area having evaluation patterns arranged on an outer peripheral side of a circuit pattern, the overlapping area overlapping respective exposure areas adjacent to four sides of the exposure area, the method including: measuring a printing misalignment between each evaluation pattern of adjacent exposure areas printed on the substrate; and calculating a plurality of linear components in an exposure operation of the exposure apparatus based on the result of the measurement of the printing misalignment and suppressing and controlling the printing misalignment based on the plurality of linear components, thereby the objective described above being achieved.

Preferably, the number of the at least one evaluation pattern in the exposure operation evaluation method for an exposure apparatus according to according to the present invention provided on each of four sides of the exposure area is one to eight. In an Embodiment according to the present invention, two evaluation patterns are provided on each of the four sides of the exposure area. Furthermore, when distortion of the exposure apparatus is measured, seven to eight evaluation patterns are provided on each of the four sides of the exposure area. In either way, the condition of the exposure apparatus can be more accurately comprehended if more evaluation patterns are provided on each side.

Furthermore, preferably, the at least one evaluation pattern in the exposure operation evaluation method for an exposure apparatus according to according to the present invention is at least provided on both end portions of the overlapping area on the exposure areas in a longitudinal direction except an overlapping portion of the exposure areas in the diagonal direction. In other words, the at least one evaluation pattern is at least provided on both end portions of the overlapping area on adjacent exposure areas in a longitudinal direction except an overlapping portion of the exposure areas in the diagonal direction.

Still further, preferably, the at least one evaluation pattern in the exposure operation evaluation method for an exposure apparatus according to according to the present invention is provided on four corner portions of the exposure area.

Still further, preferably, in the exposure operation evaluation method for an exposure apparatus according to according to the present invention, a reference position for connecting the exposure areas by the step-movement is a position parallel to a long side of the overlapping area and a center line of a short side of the overlapping area.

Still further, preferably, the width of the overlapping area in the exposure operation evaluation method for an exposure apparatus according to according to the present invention is greater than or equal to 50 μm and less than or equal to 100 μm.

Still further, preferably, the at least one evaluation pattern in the exposure operation evaluation method for an exposure apparatus according to according to the present invention is a figure pattern in a circular shape, a polygonal shape, a lattice-shape, a groove-shape or a combination thereof.

Still further, preferably, in the exposure operation evaluation method for an exposure apparatus according to according to the present invention, the at least one evaluation pattern of one of the adjacent exposure areas is a small figure pattern, the at least one evaluation pattern of the other adjacent exposure area is a large figure pattern, and an allowable range is set based on whether the small figure pattern is accommodated in the large figure pattern, or it is measured whether the errors of the central coordinates of the large figure pattern and the small figure pattern are within the allowable range.

Still further, preferably, in the exposure operation evaluation method for an exposure apparatus according to according to the present invention, a printing target position of the exposure area formed on the substrate is set depending on a distortion of an exposure apparatus, the exposure apparatus being used for forming subsequent layers.

Still further, preferably, the measurement of the printing misalignment in the exposure operation evaluation method for an exposure apparatus according to according to the present invention is performed in unit of lot.

Still further, preferably, the measurement of the printing misalignment in the exposure operation evaluation method for an exposure apparatus according to according to the present invention is performed on a first layer and/or a halfway layer of a second layer and its subsequent layers on the substrate.

Still further, preferably, the measurement of the printing misalignment in the exposure operation evaluation method for an exposure apparatus according to according to the present invention is performed by measuring a printing misalignment between each evaluation pattern of the adjacent exposure areas by using an overlapping precision measurement device and calculating a plurality of linear components based on the measured printing misalignment, each evaluation pattern respectively being printed on arbitrary number of four to ten exposure areas on the substrate.

Still further, preferably, in the exposure operation evaluation method for an exposure apparatus according to according to the present invention, the printing misalignment of the at least one evaluation pattern formed on the substrate is managed and corrected so as to make a shot result in an exposure step constant in a predetermined allowable range and stabilize overlapping accuracy in subsequent layers.

Still further, preferably, as the plurality of linear components in the exposure operation evaluation method for an exposure apparatus according to according to the present invention, at least two linear components of a substrate offset component, a substrate scaling component, a substrate rotation component, a substrate orthogonal-degree component, a shot scaling component, shot rotation component and a shot orthogonal-degree component are calculated.

Still further, the exposure apparatus in the exposure operation evaluation method for an exposure apparatus according to according to the present invention is a scanning-type reduced projection exposure apparatus, and the scanning-type reduced projection exposure apparatus is adjusted and controlled such that linear components relating to shot result in "0", the linear components uncorrectable by a full-field-type reduced projection exposure apparatus.

Still further, preferably, in the exposure operation evaluation method for an exposure apparatus according to according to the present invention, the at least one evaluation pattern is arranged on the center line or a position line-symmetrical with respect to the center line.

Still further, preferably, in the exposure operation evaluation method for an exposure apparatus according to according to the present invention, one and the other of the at least one evaluation pattern of one of the adjacent exposure areas are arranged in an outer peripheral side area and an inner peripheral side area of the overlapping area, respectively, and the other and one of the at least one evaluation pattern of the other adjacent exposure area are arranged so as to correspond to the one and the other of the at least one evaluation pattern of the one of the adjacent exposure areas.

Still further, preferably, in the exposure operation evaluation method for an exposure apparatus according to according to the present invention, the one and the other of the at least one evaluation pattern of the adjacent exposure area are a combination of figure patterns, the figure patterns being different from each other in shape and/or size.

Still further, preferably, in the exposure operation evaluation method for an exposure apparatus according to according to the present invention, the one and the other of the at least one evaluation pattern of the adjacent exposure area are a combination of figure patterns, the figure patterns being the same to each other in shape and/or size.

A manufacturing method for semiconductor device according to the present invention for manufacturing a semiconductor device using an exposure operation evaluation method for an exposure apparatus described above according to the present invention, thereby the objective described above being achieved.

Furthermore, preferably, in the manufacturing method for semiconductor device according to the present invention, a semiconductor chip is manufactured using the overlapping area as an area for dicing between each semiconductor chip.

Owing to the structure described above, hereinafter, the function of the present invention will be described.

In the present invention, a circuit pattern as well as evaluation patterns are formed on a reticle R which is an original plate. A predetermined number of evaluation patterns is formed at positions near both end portions of each side of the reticle R. The circuit pattern and the evaluation patterns are collectively printed on a first layer on a wafer W. The original pattern of the reticle R is sequentially printed on the entire wafer W by repeating this exposure operation. When the printing is performed, an outer peripheral portion of the evaluation shot in which an evaluation pattern 2a is formed is printed so as to overlap an outer peripheral portion of an adjacent shot in which an evaluation pattern 2b is formed. It is possible to detect a printing misalignment between an evaluation shot, which is an arbitrary shot, on the substrate (wafer W) and an adjacent shot thereof, by measuring the amount of misalignment of an overlapping evaluation pattern 2a, 2b by using an overlapping accuracy measurement device 15. The overlapping evaluation pattern 2a, 2b is formed of a complex of the evaluation pattern 2a and the evaluation pattern 2b.

Additionally, since the number of evaluation marks and the arrangement position of the evaluation marks are the features of the present invention, it is possible to calculate a misalignment value of the linear components of the exposure apparatus in a comprehensive manner. Owing to this, the accuracy checking of the exposure apparatus can be collectively in a comprehensive manner, thereby being able to simplify steps of manufacturing a semiconductor device. Furthermore, since the circuit pattern as well as the evaluation patterns are formed, a step of evaluating the exposure apparatus and a step for the first layer can be simultaneously performed, thereby being able to simplify steps of manufacturing the semiconductor device and making the positional relationship between the circuit pattern and the evaluation patterns always constant by forming both patterns at the same time.

As described above, according to the present invention, it is possible to significantly improve the overlapping accuracy of a subsequent layer by managing and correcting an important target layer (a first layer or a layer subsequent to the first layer) to an ideal value. Since the variation of the subsequent layer can be managed and can be fed back to the target layer, and the exposure apparatus can always follow a change-over-time and an abrupt change of the exposure apparatus, the evaluation method for arranging, managing and correcting evaluation patterns according to the present invention is effective in order to maintain and improve the overlapping accuracy of each subsequent layer. In a manufacturing method for semiconductor device using this evaluation method, exposure apparatuses, which has been used in generations prior to the previous generation, can be effectively utilized for the objective of cost reduction.

These and other advantages of the present invention will become apparent to those skilled in the art upon reading and understanding the following detailed description with reference to the accompanying figures.

BRIEF DESCRIPTION OF THE DRAWINGS

FIG. 7 is a view showing shot scaling components among a variety of linear components.

FIG. 8 is a view showing shot rotation components and shot orthogonal-degree component among a variety of linear components.

FIG. 10(a) is a view showing a case in which two evaluation patterns are provided on each side of the shot; and FIG. 10(b) is a view showing a case in which one evaluation pattern is provided on each side of the shot.

Figure 1:
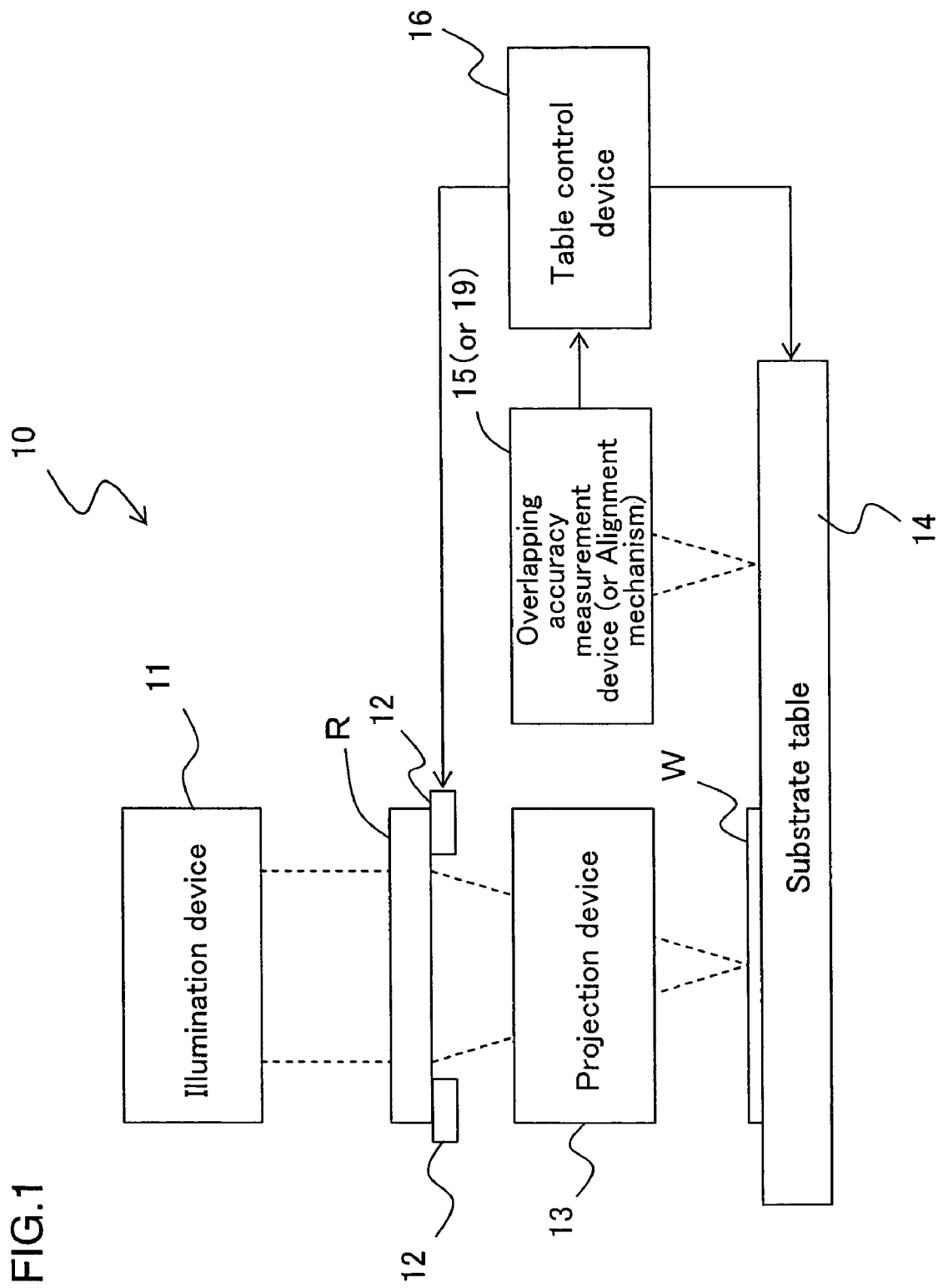
FIG. 1 is a block diagram showing a structural example of a scanning-type reduced projection exposure apparatus (scanner) used in an exposure operation evaluation method in the exposure apparatus according to an Embodiment of the present invention.

1 example of arrangement of an evaluation shot and adjacent shots
2a, 3a1 to 3a4 evaluation pattern of evaluation shot (abbreviation symbol=X)
2b, 3b evaluation pattern of adjacent shot (abbreviation symbol=○)
2a, 2b evaluation pattern (abbreviation symbol=○X)
10 scanning-type reduced projection exposure apparatus (scanner)
11 illumination device
12 reticle table
13 projection device
14 substrate table
15 overlapping accuracy measurement device
16 table control device
17 evaluation shot
18 adjacent shot
R original plate (reticle)
R1 overlapping area with adjacent shots
W wafer (substrate)

DESCRIPTION OF THE PREFERRED EMBODIMENTS

Hereinafter, embodiments for each of an exposure operation evaluation method for exposure apparatus and a manufacturing method for semiconductor device using the exposure operation evaluation method according to the present invention will be described with reference to the accompanying drawings. In each figure, members which obtain the same working effect to each other are denoted by the same reference numerals.

First, before the detailed contents of the present invention are described, the outline of the present invention will be described.

In the manufacturing method for semiconductor device according to the present invention, evaluation patterns of an overlapping accuracy evaluation mark are printed on a substrate, and the amount of printing misalignment between each evaluation pattern of an evaluation shot and respective adjacent shots (between adjacent shots), both of which are printed on the substrate, is measured. Based on this measurement result, an exposure position of the scanning-type reduced projection exposure apparatus (scanner) is evaluated when a target layer (a first layer or a layer subsequent to the first layer is formed.

As described above, after evaluation patterns are printed on the substrate by the exposure apparatus, the evaluation patterns of the overlapping accuracy evaluation mark between an evaluation shot and respective adjacent shots (between adjacent shots) will be evaluated by using the overlapping accuracy measurement device 15, which will be described later with reference to FIG. 1. The arrangement position of the evaluation patterns is set as follows. Each evaluation pattern is arranged at two or more positions on each side so as to be close to the corner of each of the four sides of an area to be printed of an original plate (reticle R), and the evaluation patterns on the four sides of the printed shot on a substrate which is to be measured and each evaluation pattern formed on the four printed shots (i.e., adjacent shots) adjacent to a printed shot for measurement (i.e., evaluation shot) overlap each other. Each evaluation pattern is arranged on the original plate (reticle R) so as to be respectively resolved on the substrate.

Herein, the original plate indicates a concept including a mask and a reticle, and the substrate indicates a concept including a wafer for integrated circuit and a glass plate for liquid crystal display apparatus. The result of the exposure operation to be evaluated is a printing misalignment (including the amount of positional misalignment and the direction thereof) from an ideal position to be printed on the substrate for each printed shot in a step exposure. The performance of the exposure apparatus includes lens aberration (lens distortion, coma aberration), overlapping accuracy, stage-stepping accuracy, reduced projection magnification control accuracy, reticle rotation accuracy, shot alignment accuracy, stage synchronization accuracy between the original plate and the substrate by the scanning-type reduced projection exposure apparatus (scanner) and an overall varying value which combines change values over time within each accuracy allowable range resulting from the exposure apparatus and also includes misalignment at the time of creating the original plate as another factor.

Hereinafter, the specific contents of the present invention will be described in order.

FIG. 1 is a block diagram showing a structural example of a scanning-type reduced projection exposure apparatus (scanner) used in an exposure operation evaluation method for the exposure apparatus according to an Embodiment of the present invention.

In FIG. 1, the scanning-type reduced projection exposure apparatus (scanner) 10 includes an illumination device 11, a reticle table 12, a projection device 13, a substrate table 14, an overlapping accuracy measurement device 15 and a table control device 16. The illumination device 11 emits illumination light. The reticle table 12 can mount thereon an original plate of reticle R on which an evaluation pattern and a circuit pattern for a first layer are provided. The projection device 13 reduces the illumination light, which has passed through the reticle R, and projects it onto a substrate (wafer W). The substrate table 14 is capable of driving itself so as to move the substrate (wafer W) mounted thereon for each predetermined step. The overlapping accuracy measurement device 15 optically reads an exposure pattern of the substrate (wafer W) on the substrate table 14, measures the amount of misalignment and the direction thereof between respective evaluation patterns of adjacent shots and an evaluation pattern of an evaluation shot and calculates a variety of linear components, which will be describe later, based on the measurement result. Other than controlling the step movement of the substrate table 14, the table control device 16 can correct and control the position of the reticle table 12 and substrate table 14 based on the variety of calculated linear components.

Alternatively, in FIG. 1, it is also possible to structure that the scanning-type reduced projection exposure apparatus (scanner) 10 includes an illumination device 11, a reticle table 12, a projection device 13, a substrate table 14, an alignment mechanism 19 and a table control device 16. The illumination device 11 emits illumination light. The reticle table 12 can mount thereon an original plate of reticle R on which an evaluation pattern and a circuit pattern for a first layer are provided. The projection device 13 reduces the illumination light, which has passed through the reticle R, and projects it onto a substrate (wafer W). The substrate table 14 is capable of driving itself so as to move the substrate (wafer W) mounted thereon for each predetermined step. The alignment mechanism 19 optically reads and measures a mark on the substrate table 14 and a measurement mark of the substrate (wafer W), and calculates a variety of linear components based on the measurement result. Other than controlling the step movement of the substrate table 14, the table control device 16 can correct and control the position of the reticle table 12 and substrate table 14 based on the variety of calculated linear components. (i) Calculating the misalignment amount of the evaluation patterns printed by the scanning-type reduced projection exposure apparatus (scanner) 10, (ii) calculating a variety of linear components, which will be described later, (iii) determining whether the lot corresponding to the printed evaluation patterns can be flowed and (iv) a feedback for subsequent lots are performed by the overlapping accuracy measurement device 15, which is provided separately from the alignment mechanism 19.

As described above, using the scanning-type reduced projection exposure apparatus (scanner) 10, a number of types of accuracy checking (e.g., a stage-stepping accuracy in X direction and Y direction, a reticle rotation accuracy and etc.) for the first layer can be comprehensively and collectively performed by detecting and evaluating a printing misalignment between each step adjacent shot. Thus, steps for manufacturing a semiconductor device can be simplified and the position of the first layer for a subsequent second layer can be adjusted and controlled with excellent accuracy. Hereinafter, the details of the Embodiment will be described.

Figure 2:
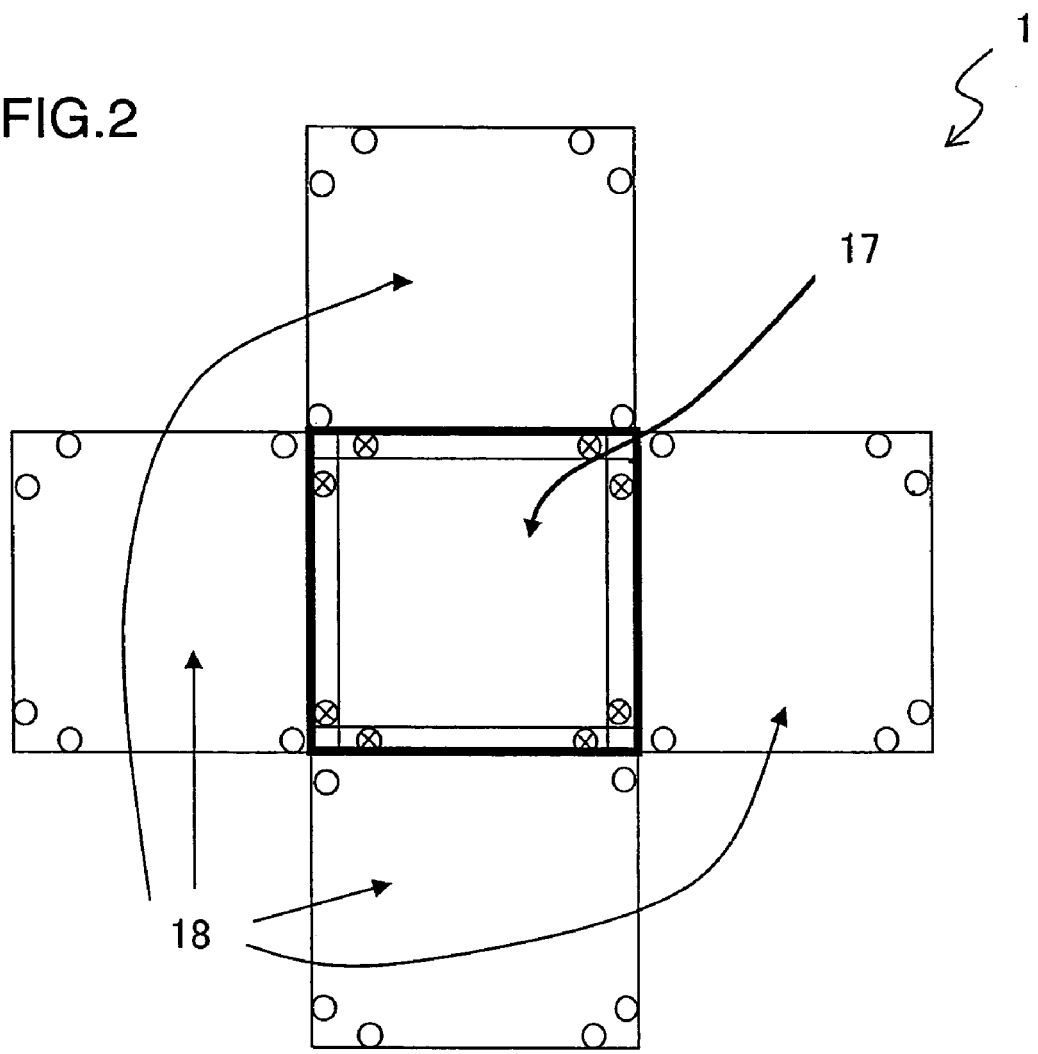
FIG. 2 is a plain view showing a relationship between an evaluation pattern of an evaluation shot and evaluation patterns of step adjacent shots which are located above, below, left and right in a plain view with respect to the evaluation pattern of the evaluation shot according to the Embodiment in the exposure operation evaluation method for the exposure apparatus shown in FIG. 1.

FIG. 2 is a plain view showing a relationship between an evaluation pattern of an evaluation shot and evaluation patterns of step adjacent shots which are located above, below, left and right in a plain view with respect to the evaluation pattern of the evaluation shot according to the Embodiment in the exposure operation evaluation method for the exposure apparatus shown in FIG. 1.

In FIG. 2, an arrangement example 1 of the evaluation shot and the step adjacent shots according to the Embodiment shows a case in which each exposure shot has a shape of quadrangle (or rectangle). Among a plurality of exposure areas (shots) which have been printed on the wafer, an evaluation pattern of an evaluation shot 17 and evaluation patterns of four step adjacent shots 18 which are located above, below, left and right to the evaluation shot 17 are shown. An end edge portion of one side of the evaluation pattern of each adjacent shot 18 is respectively arranged on each inside of four sides of the evaluation shot 17. In other words, the outer peripheral area of the evaluation shot 17 arranged so as to overlap the end edge portion (evaluation area) of one side of evaluation pattern of each step adjacent shot 18.

FIG. 2 shows a case in which evaluation patterns are arranged in an ideal arrangement state. The ideal arrangement position of the evaluation patterns, which will be described later in detail, is, in other words, that evaluation patterns "X" in the evaluation areas of the four sides of the evaluation shot are positioned within white circles "○" of the evaluation pattern in the outer peripheral areas (evaluation areas) of the adjacent shots, and they are not misaligned to each other.

A circuit pattern for the first layer is provided inside the evaluation area of four sides (outer peripheral areas) of the evaluation shot. Owing to this, an evaluation step of evaluating an exposure position for an exposure operation and a manufacturing step of manufacturing the semiconductor device can be simultaneously performed. The scanning-type reduced projection exposure apparatus (scanner) 10 can perform the manufacturing step of manufacturing the first layer while the scanning-type reduced projection exposure apparatus (scanner) 10 is running for a positional accuracy evaluation. Therefore, the number of manufacturing-hours and the cost of manufacturing can be reduced. Also, the positional relationship between the circuit pattern and the evaluation patterns can be always constant by forming both patterns at the same time.

Figure 3:
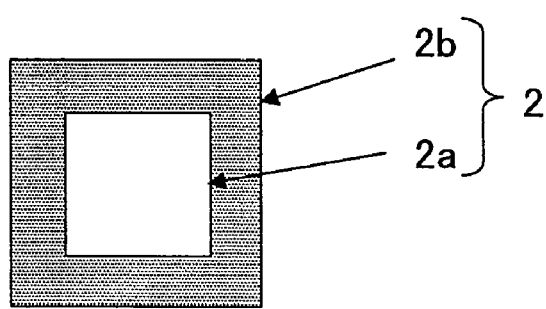
FIG. 3 is an enlarged view showing an example of each evaluation pattern shown in FIG. 2.

FIG. 3 is an enlarged view showing an example of each evaluation pattern shown in FIG. 2.

As shown in FIG. 3, among polygonal shapes and circular shapes, for example, a large quadrangular portion located in the outer area (portion in halftone dot) is, for example, an evaluation pattern 2b which is formed on an adjacent shot, and in FIG. 2, it is shown using an abbreviation symbol of white circle "○". A small quadrangular portion, which is located inside the large quadrangular shape (portion in white) is an evaluation pattern 2a which is formed on an evaluation shot, and in FIG. 2, it is shown using an abbreviation symbol of "X" mark. If misalignment between the central coordinates of the small quadrangular evaluation pattern 2a of the evaluation shot and the central coordinates of the large quadrangular evaluation pattern 2b of the adjacent shot is within a predetermined range, for example, less than or equal to 0 to 2 μm, the misalignment can be considered to be within an allowable range of a step misalignment. Alternatively, if the small quadrangular evaluation pattern 2a of the evaluation shot is located within the large quadrangular evaluation pattern 2b of the adjacent shot, this can be considered within the allowable range of the step misalignment, or the errors of the central coordinates of the small quadrangular evaluation pattern 2a of the evaluation shot and the large quadrangular evaluation pattern 2b of the adjacent shot are measured, respectively, so as to determine if the printing has been performed within the allowable range.

FIG. 4(a) to (d) are enlarged views of a plurality of the evaluation pattern shown in FIG. 2 other than the evaluation pattern shown in FIG. 3.

FIG. 4(a) to (d) show an example of an evaluation mark (evaluation pattern) which is measured by the overlapping accuracy measurement device 15, respectively. An evaluation pattern in FIG. 4(a) is the same as the evaluation patterns 2a and 2b shown in FIG. 3. Evaluation patterns shown in FIGS. 4(b) and (c) are examples of groove-shaped patterns, and it is considered within the allowable range of the positional misalignment if a groove-shaped pattern 3a2 is located within a groove-shaped pattern 3a1. Alternatively, the allowable range is set as a quadrangular evaluation pattern 3b (halftone dot portion), and if the groove-shaped patterns 3a1 and 3a2 are located within the evaluation pattern 3b, this can be considered to be within the allowable range of the positional alignment. In this case, the positional misalignment for the groove-shaped pattern 3a1 can be determined more strictly than that for the groove-shaped pattern 3a2. The evaluation pattern 3b with the halftone dot area and the groove-shaped patterns 3a1 and 3a2 correspond to the evaluation pattern of the evaluation shot and the evaluation patterns of the adjacent shots, respectively. Alternatively, if the error of the central coordinates of the groove-shaped pattern 3a1 and groove-shaped pattern 3a2 are located within a predetermined range, this can be determined within the allowable range of the step misalignment. The groove-shaped pattern 3a1 and groove-shaped pattern 3a2 correspond to the evaluation pattern 2b of the adjacent shot and the evaluation pattern 2a of the evaluation shot, respectively.

An evaluation pattern shown in FIG. 4(d) is an example of a lattice-shaped pattern. Lattice column evaluation patterns 3a3 with halftone dots and lattice column evaluation patterns 3a4 without halftone dots are alternately provided in eight divided areas. The allowable range of the positional misalignment is that they do not overlap each other. The lattice column evaluation patterns 3a3 with halftone dots and the lattice column evaluation patterns 3a4 without halftone dots correspond to the evaluation pattern of the evaluation shot and the evaluation patterns of the adjacent shots, respectively. Alternatively, the evaluation pattern shown in FIG. 4(d) is an example of a lattice-shaped pattern. Lattice column evaluation patterns 3a3 with halftone dots and lattice column evaluation patterns 3a4 without halftone dots are alternately provided in eight divided areas. If the central coordinates of each column evaluation pattern is located within a predetermined range, this can be determined to be within an allowable range of the step misalignment. The lattice column evaluation patterns 3a3 with halftone dots and the lattice column evaluation patterns 3a4 without halftone dots correspond to the evaluation pattern 2a of the evaluation shot and the evaluation pattern 2b of the adjacent shot, respectively.

The size of the evaluation marks is related to the accuracy of the positional misalignment. However, this is defined in a specification relating to the evaluation mark (evaluation pattern) for the overlapping accuracy measurement device 15. Thus, the detailed description of the size of the evaluation marks is omitted herein since the present invention is not intended to improve the shape of the mark.

Figure 4:
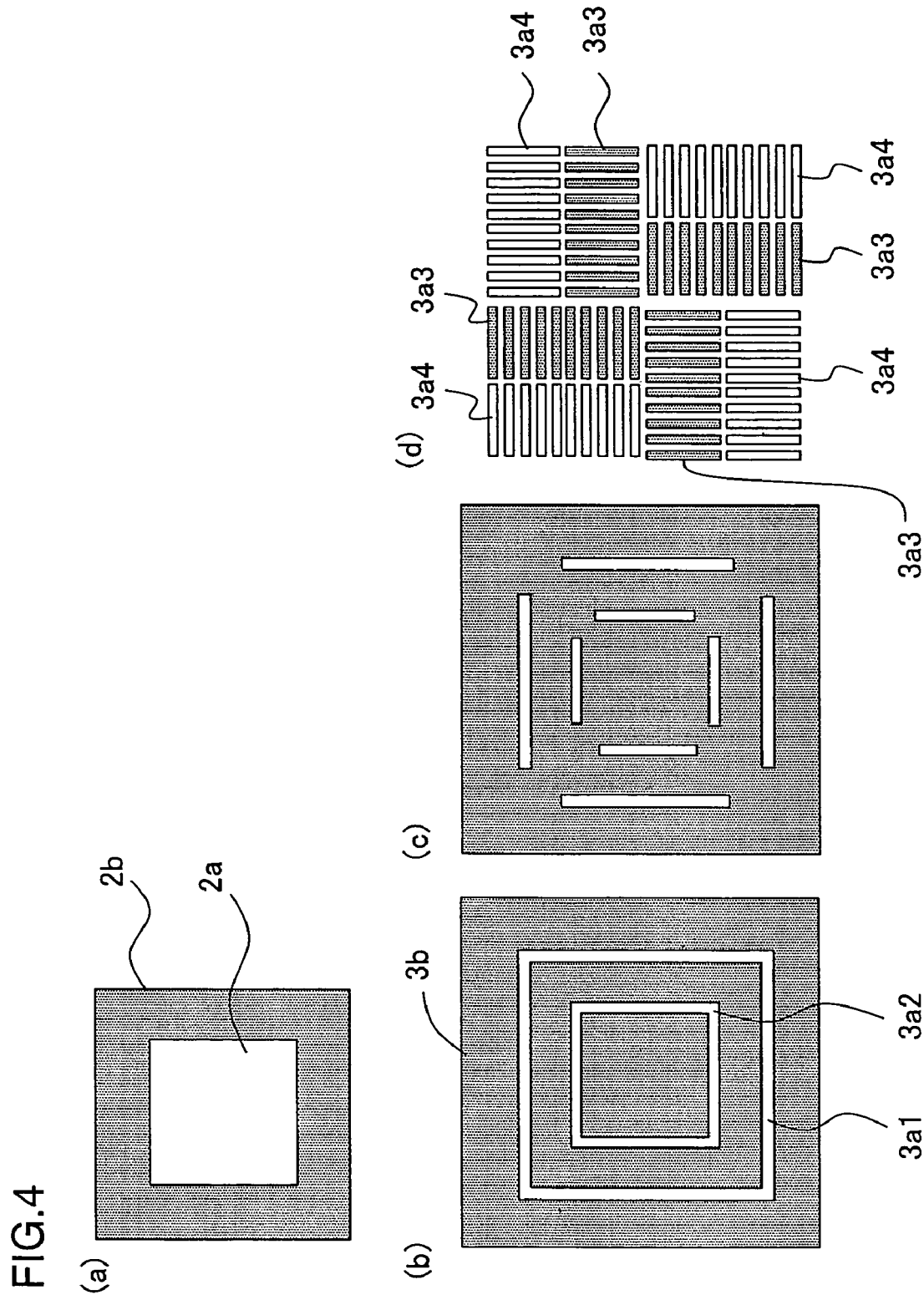
FIG. 4 is an enlarged view of a plurality of the evaluation patterns shown in FIG. 2 other than the evaluation pattern shown in FIG. 3.

Additionally, as an evaluation mark for overlapping accuracy, a reference mark in the overlapping accuracy measurement device 15 can be processed. For example, a variety of existing evaluation patterns for the positional misalignment measurement as shown in FIG. 4 is arranged, and the positional misalignment can be measured by the overlapping accuracy measurement device 15.

In this case, based on the result of the positional misalignment measurement of, for example, the overlapping evaluation pattern 2a, 2b by the overlapping accuracy measurement device 15, a software is applied to a full-field-type reduced projection exposure apparatus or the scanning-type reduced projection exposure apparatus 10, the software collectively calculating a variety of linear components as shown in FIG. 5 to FIG. 8. The overlapping accuracy measurement device 15 calculates the misalignment amount of the overlapping evaluation pattern 2a, 2b and a user feeds the misalignment amount of the calculated linear components back to the table control device 16 of the scanning-type reduced projection exposure apparatus 10. In other words, after the completion of the exposing step, the result calculated by the overlapping accuracy measurement device 15, which is a separate device, is fed back to the exposure apparatus 10. Alternatively, nothing special is implemented on the operation of the overlapping accuracy measurement device 15, and specified marks (evaluation patterns 2a and 2b) within the wafer, in which resist patterns are formed, are measured and the result calculated by embedded software can be fed back, by an operator or automatically, to the exposure apparatus 10.

Hereinafter, the linear components described above will be described. As a variety of linear components, wafer offset components and wafer scaling components (FIG. 5), wafer rotation components and wafer orthogonal-degree components (FIG. 6), shot scaling components (FIG. 7) and shot rotation components and a shot orthogonal-degree component (FIG. 8) are shown.

Figure 5:
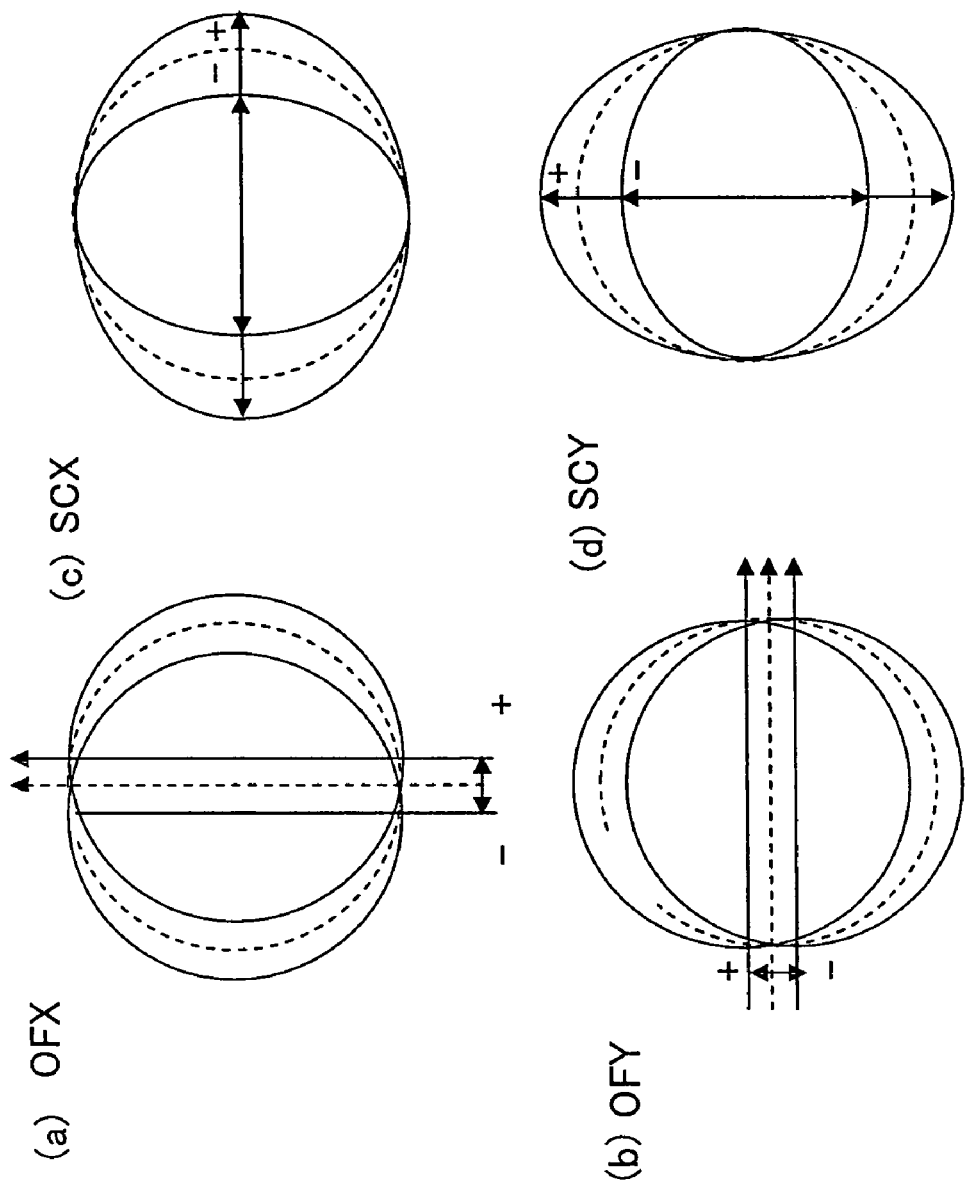
FIG. 5 is a view showing wafer offset components and wafer scaling components among a variety of linear components.

FIG. 5 is a view showing the wafer offset components and the wafer scaling components among a variety of linear components.

FIG. 5(a) shows a wafer offset X component. FIG. 5(b) shows a wafer offset Y component. FIG. 5(c) shows a wafer scaling X component. FIG. 5(d) shows a wafer scaling Y component.

Figure 6:
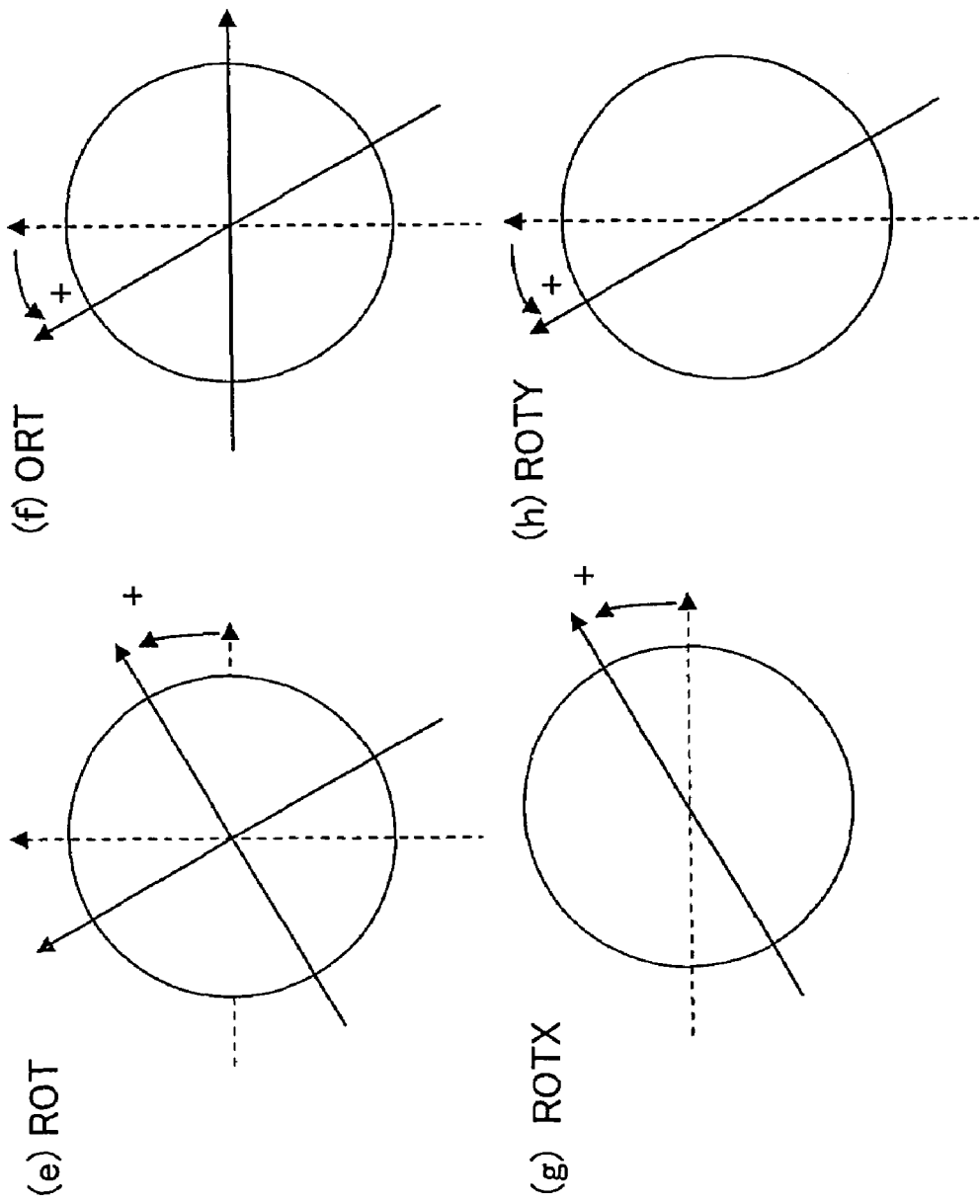
FIG. 6 is a view showing wafer rotation components and wafer orthogonal-degree components among a variety of linear components.

FIG. 6 is a view showing the wafer rotation components and the wafer orthogonal-degree components among a variety of linear components.

FIGS. 6(e), (g) and (h) show the wafer rotation components. FIG. 6(f) shows the wafer orthogonal-degree component. The wafer rotation components include a wafer rotation X component shown in FIG. 6(g) and a wafer rotation Y component shown in FIG. 6(h).

FIG. 7 is a view showing the shot scaling components among a variety of linear components. The shot scaling components include a shot scaling component (X component and Y component) shown in FIG. 7(i), a shot scaling X component shown in FIG. 7(j) and a shot scaling Y component shown in FIG. 7(k).

FIG. 8 is a view showing the shot rotation components and the shot orthogonal-degree component among a variety of linear components. FIG. 8(l) and (m) show the shot rotation components. FIG. 8(n) shows the shot orthogonal-degree component. The shot rotation components include a shot rotation X component shown in FIG. 8(l) and a shot rotation Y component shown in FIG. 8(m).

The aforementioned linear components shown in FIG. 5 and FIG. 6 relate to the wafer. The aforementioned linear components shown in FIG. 7 and FIG. 8 relate to the shot.

In the Embodiment, when a desired number of the evaluation patterns 2a and 2b is arranged on a desired location of the outer peripheral portion of the reticle R, then the evaluation patterns 2a and 2b are optically detected by the overlapping accuracy measurement device 15, and based on the misalignment amount, types of the linear components as shown in FIG. 5 to FIG. 8 can be simultaneously calculated.

Regarding linear components which can be corrected by the full-field-type reduced projection exposure apparatus and the scanning-type reduced projection exposure apparatus 10, the full-field-type reduced projection exposure apparatus (stepper) can correct the following eight linear components: wafer offset (X, Y) components OFX, OFY (a, b), wafer scaling (X, Y) components SCX, SCY (c, d), a wafer rotation component ROT (e), a wafer orthogonal-degree component ORT (f), a shot scaling component MAG (i) and a shot rotation component RR (l).

Additionally, there are cases in which the wafer rotation component ROT (e) and the wafer orthogonal-degree component ORT (f) are shown as wafer rotation (X, Y) components ROTX, ROTY (g, h). The positive and negative directions of the components are different due to the definition of each apparatus. However, the relationship between the positive direction and the negative direction in FIG. 6 is shown in the following expression.

$$ORT=ROTY-ROTX$$

The scanning-type reduced projection exposure apparatus (scanner) 10 can correct the following ten linear components: wafer offset (X, Y) components OFX, OFY (a, b), wafer scaling (X, Y) components SCX, SCY (c, d), a wafer rotation component ROT (e), a wafer orthogonal-degree component ORT (f), shot scaling (X, Y) components MAGX, MAGY (j, k), a shot rotation component RRX (l) and a shot orthogonal-degree component SKEW (n).

Additionally, there are cases in which the shot rotation component (l) and the shot orthogonal-degree component (n) are shown as shot rotation (X, Y) components RRX, RRY (l, m). The positive and negative directions of the components are different due to the definition of each apparatus. However, the relationship between the positive direction and the negative direction in FIG. 6 is shown in the following expression. There are cases in which the wafer rotation component (e) and the wafer orthogonal-degree component (f) are shown as wafer rotation (X, Y) components ROTX, ROTY (g, h). The relationship between the positive direction and the negative direction has already been described above.

$$SKEW=RRY-RRX$$

Herein, an ideal arrangement of evaluation patterns will be further described.

FIG. 2 shows a schematical view of an arrangement state on a substrate (wafer W) having abbreviation symbol X (evaluation pattern 2a shown in FIG. 3) and ○ (evaluation patterns 2b shown in FIG. 3) arranged thereon.

FIG. 2 shows an ideal printed state. In other words, FIG. 2 shows an apparatus state and a processed state of an original plate (reticle R), in which each shot is sequentially printed in an ideal lattice and also shows that each shot to be printed on the substrate (wafer W) is shot at an ideal position with the alignment accuracy and the stepping accuracy.

In order to configure the structure described above, the evaluation patterns 2a and 2b, which are overlapping accuracy evaluation marks, are formed on each end edge portion of the four sides of the original plate (reticle R). It is necessary to resolve an overlapping accuracy evaluation mark 2, which is a complex comprised of the evaluation patterns 2a and 2b, on the position where a shot which is measured on the substrate (wafer W) (i.e., evaluation shot) and adjacent shots which are adjacent to the evaluation shot overlap each other.

Figure 9:
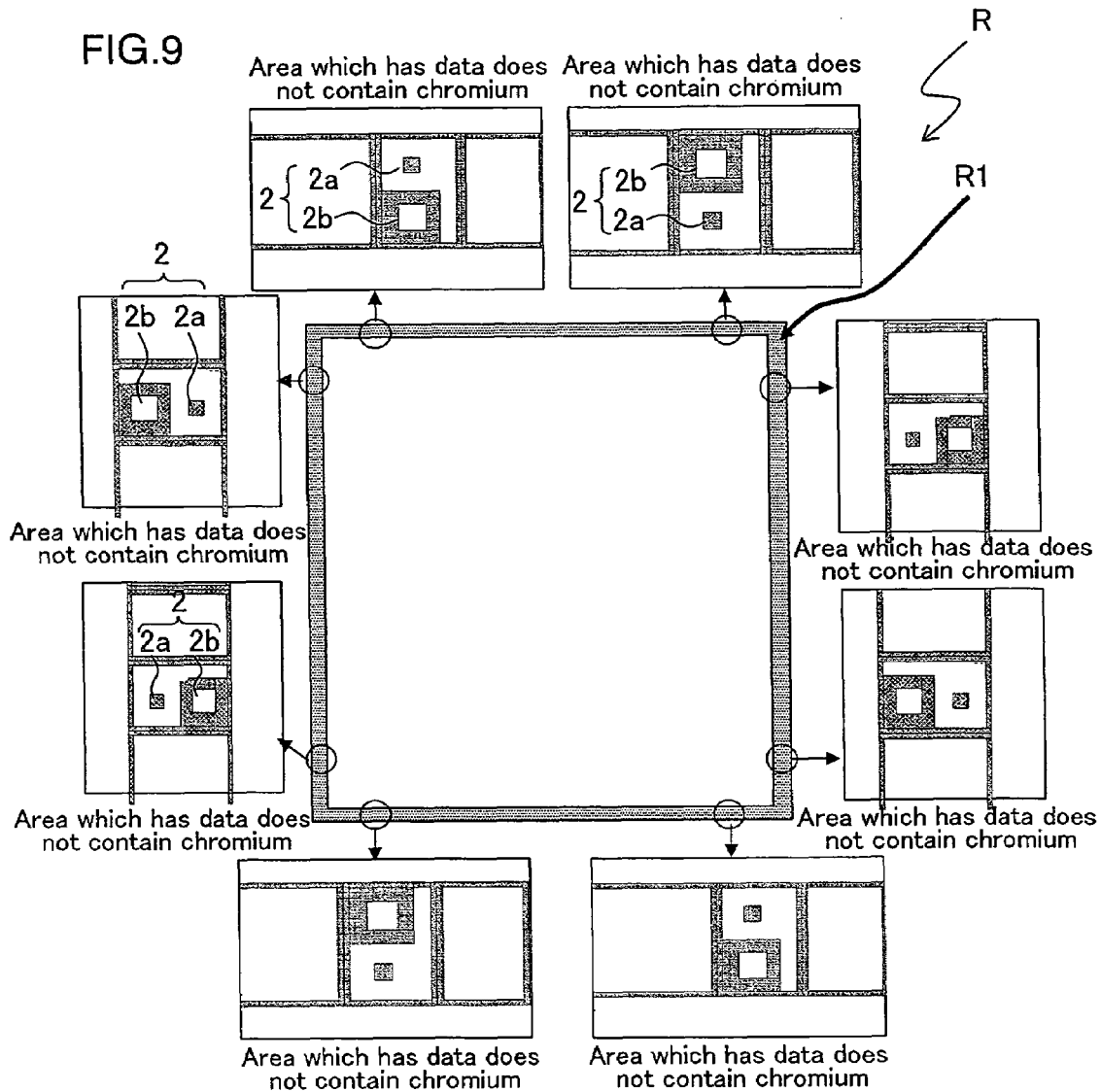
FIG. 9 is a plane view showing example of arrangement of each evaluation pattern in an original plate (reticle) according to an Embodiment of the present invention.

The example shown in FIG. 2 represents an arbitrary shot on the substrate as an evaluation shot 17 and shots adjacent to the four sides of the evaluation shots 17 as adjacent shots 18. In order to print the evaluation patterns 2a and 2b, the abbreviation symbol ○ of patterns (evaluation patterns 2b) which are formed on the adjacent shots and the abbreviation symbol of X of patterns (evaluation patterns 2a) which are formed on the evaluation shot shown in FIG. 2 are arranged on the original plate (reticle R) so as to overlap each other on the substrate. FIG. 9 shows an example of layout in which these evaluation patterns 2a and 2b are arranged on the original plate.

In FIG. 9, the evaluation patterns 2a and 2b on the reticle R are formed on an overlapping area R1 where the adjacent shots (i.e., outer periphery portion of each of the four sides of the reticle R) overlap with the evaluation shot when the evaluation patterns 2a and 2b are printed on the wafer W (substrate). The evaluation patterns 2a and 2b are formed on a position close to both ends of each side of the reticle R.

In the case shown in FIG. 9, the evaluation patterns 2a and 2b or the evaluation patterns 2b and 2a are, respectively, formed in an outer peripheral side area and an inner peripheral side area in the overlapping area R1 of the outer peripheral portion of the four sides of the reticle R. Furthermore, when the center of the reticle R, the top-to-bottom direction on the paper and the left-to-right direction on the paper are set as the origin, the y-axis and the x-axis, respectively, then, patterns of the evaluation patterns 2a and 2b, which are formed along the longitudinal side of the reticle R, are formed on a position so as to be symmetrical to each other with respect to the y-axis and patterns of the evaluation patterns 2a and 2b, which are formed along the latitudinal side of the reticle R, are formed on a position so as to be symmetrical to each other with respect to the x-axis.

As shown in FIG. 9, exposure is sequentially performed on the substrate (wafer W) such that each of the central lines of the overlapping area R1 with adjacent shots coincides with each other at the time of overlapping with the adjacent shots. As described above, a reference position for connecting shots by the step-movement is a position parallel to a long side of the overlapping area R1 and a center line of a short side of the overlapping area R1. The evaluation patterns 2a and 2b are arranged on the center line (FIG. 2) or a position line-symmetrical with respect to the center line (FIG. 9), respectively. The width of the overlapping area R1 is preferably approximately 50 μm to several hundreds μm. In the Embodiment, it is set as approximately 100 μm.

In FIG. 2, the evaluation patterns 2a and 2b are formed on an area, on the substrate (wafer W), where each shot is set so as to overlap each other. The plurality of evaluation patterns 2a and 2b are arranged at two positions near each corner (except the overlapping areas of shots at corners in a diagonal direction) of each of the four sides of the evaluation shot 17. In other words, the evaluation patterns 2a and 2b are at least provided on both ends of the side in the longitudinal direction of two adjacent shots (adjacent exposure areas to the left and right or above and below) of the overlapping area R1 except that portions where each shot orthogonal to each other overlaps each other (exposure areas in a diagonal direction). The reason that the evaluation patterns 2a and 2b are arranged at positions near the corner of the side is that the more significantly a misalignment appears, the farther the distance from the evaluation patterns to the center of the shot is.

In this state, the misalignment of a variety of linear components as shown in FIG. 5 to FIG. 8 is calculated based on the result of the measurement after the positions of the evaluation patterns 2a and 2b are measured by the overlapping accuracy measurement device 15. Additionally, even when a variety of accuracy of the exposure apparatus has misalignment, this can be determined based on the result measured by the overlapping accuracy measurement device 15 since a fixed (not linear component) amount of misalignment is generated. Other than the components described above, as non-linear components, there is a complex numerical value, such as an misalignment amount of each accuracy of the exposure apparatus, an amount of change-over-time within an allowable range, an misalignment of processed accuracy of the original plate (i.e., reticle R).

With the structure described above, hereinafter, an example of an exposure operation evaluation method for the exposure apparatus according to the present invention, in which the scanning-type reduced projection exposure apparatus (scanner) is used for a first layer and the full-field-type reduced projection exposure apparatus (stepper) is used for layers subsequent to the first layer, will be described.

As shown in FIG. 9, the original plate (reticle R) is mounted on the reticle table 12, wherein the overlapping area R1 with the adjacent shots 18 is arranged on each side of the original plate (reticle R) and a circuit pattern is arranged in the center thereof (In many cases, since a plurality of chips as well as the circuit pattern are mounted in this center, there is a scribing line, which is an area for performing a dicing between chips (the width of the area is set the same as that of R1). The first layer of the substrate (wafer W) on the substrate table 14 is sequentially moved step by step and exposed to light by the illumination device 11 and the projection device 13 of the scanning-type reduced projection exposure apparatus (scanner) 10. Since the evaluation pattern of the evaluation shot 17 has more sufficient resolution margin than the circuit pattern in the center of the evaluation shot 17, a photo step is performed with an application of resist to be resolved, an exposure condition and a development condition for the circuit pattern which has the least resolution margin. Furthermore, the overlapping accuracy measurement device 15 measures arbitrary number of evaluation patterns (specifically, four to ten shots of evaluation patterns) on the exposed substrate (wafer W) and calculate each linear component based on the measurement result.

An allowable range is provided for the measurement result of the evaluation pattern and each linear component, respectively. However, especially, the offset value of the first layer is set such that the linear components (the shot scaling X (j) and Y (k) and the shot orthogonal-degree (n)), which can not be corrected by the full-field-type reduced projection exposure apparatus (stepper), results in "0". Specifically, the shot scaling component is controlled in the range of 0±0.5 ppm. The shot orthogonal-degree (n) and the shot rotation component are controlled in the range of 0±0.5 µRad (or ppm). The numerical value of the allowable value can be changeable depending on the accuracy of the exposure apparatus.

Controlling is performed such that the difference between the shot scaling X component (j) and the shot scaling Y component (k) is less than or equal to 0.5 ppm. The reason for that is, for example, in the allowable range, if the shot scaling X component (j) is −0.5 ppm and the shot scaling Y component (k) is +0.5 ppm, the difference in absolute value between the X component and the Y component results in 1.0 ppm. In this case, in the linear component (i) which can be corrected by the full-field-type reduced projection exposure apparatus (stepper), if the X component is used as a reference, the difference in the Y component is +1.0 ppm and if the Y component is used as a reference, the difference in the X component is −1.0 ppm. This will be a cause for aggravating the overlapping accuracy of layers formed by the full-field-type reduced projection exposure apparatus for layers subsequent to the first layer.

No difference between the shot scaling X component (j) and the shot scaling Y component (k) results in the difference between the shot scaling X component (j) and the shot scaling Y component (k) in absolute value to be 0 ppm, for example, when the shot scaling X component (j) is +0.5 ppm and the shot scaling Y component (k) is +0.5 ppm. In the linear component (i) which can be corrected by the full-field-type reduced projection exposure apparatus (stepper), in order to use both X component and Y component as a reference, when the correction component for the linear component (i) is +0.5 ppm, then, the remaining difference of the shot scaling component (i) with the first layer results in 0 ppm. Therefore, the overlapping accuracy of layers formed by the full-field-type reduced projection exposure apparatus for layers subsequent to the first layer can be improved.

As described above, when the scanning-type reduced projection exposure apparatus (scanner) 10 is used for the first layer, it is important that each linear component tends toward "0", especially, the linear components (j, k, n) relating to shot, which can not be corrected by the full-field-type reduced projection exposure apparatus (stepper), tends toward "0". As a result, a position of the first layer formed by the scanning-type reduced projection exposure apparatus (scanner) 10 can be adjusted and controlled with excellent accuracy for a second layer formed by the full-field-type reduced projection exposure apparatus (stepper).

Herein, the first layer is corrected and controlled as described above. In layers formed by the full-field-type reduced projection exposure apparatus (stepper) used for layers subsequent to the first layer, when there is a fixed remaining difference in a measurement point, it is considered that there are an misalignment of zero point of each accuracy between each exposure apparatus, an misalignment of zero point due to the difference of mechanism, a difference of non-linear components between each exposure apparatus and an expansion and contraction of the processed substrate from the first layer to a layer subsequent to the first layer, etc.

In this case, if components can be corrected by the exposure apparatus (either full-field-type or scanning-type) used for the layer subsequent to the first layer, the components can be corrected by the exposure apparatus used for the layer subsequent to the first layer. In contrast to the correction amount tending toward "0" in the first layer, there are cases in which the overlapping accuracy for the layer subsequent to the first layer can be improved by inputting, in the exposure apparatus 10, some correction target values for the linear components. In this case, a selection is made whether (i) the correction target value is set for the first layer, the firs layer is managed, and a correction is performed in the first layer as described above, or (ii) the exposure apparatus for the layer subsequent to the first layer is modified.

Additionally, there are devices with which the overlapping accuracy after layers subsequent to, for example, the fifth layer is important after the first to the fourth layers are structured, the first to fourth layers not being important in the overlapping accuracy. In this case, for the first layer which is a rough layer, an exposure apparatus with an excellent accuracy having a small amount of non-linear components is less used, and the misalignment amount of the first layer is dragged into subsequent layers, thereby, in some cases, affecting the overlapping accuracy of layers subsequent to the fifth layer. In such a case, while maintaining the overlapping accuracy within the allowable range with respect to a target layer (first layer), the fifth layer tends toward an ideal position on the substrate by using the evaluation pattern. For the layers subsequent to the fifth layer, the same operation as the one described above is performed.

As described above, according to the present invention, a circuit pattern as well as evaluation patterns are formed on a reticle R which is an original plate. A predetermined number of evaluation patterns is formed at positions near both end portions of each side of the reticle R in the longitudinal direction. The circuit pattern and the evaluation patterns are collectively printed on a first layer on a wafer W. The original pattern of the reticle R is sequentially printed on the entire wafer W by repeating this exposure operation. When the printing is performed, an outer peripheral portion of the evaluation shot in which an evaluation pattern 2a is formed is printed so as to overlap an outer peripheral portion of an adjacent shot in which an evaluation pattern 2b is formed. It is possible to detect a printing misalignment between an evaluation shot, which is an arbitrary shot, on the substrate (wafer W) and an adjacent shot thereof, by measuring the amount of misalignment of an overlapping evaluation pattern 2a, 2b by using an overlapping accuracy measurement device 15. The overlapping evaluation pattern 2a, 2b is formed of a complex of the evaluation pattern 2a and the evaluation pattern 2b.

Additionally, since the number of evaluation marks and the arrangement position of the evaluation marks are the features for the present invention, it is possible to calculate a misalignment value of the linear components of the exposure apparatus in a comprehensive manner. Owing to this, the accuracy checking of the exposure apparatus can be collectively in a comprehensive manner, thereby being able to simplify steps of manufacturing a semiconductor device. Furthermore, since the circuit pattern as well as the evaluation patterns are formed, a step of evaluating the exposure apparatus and a step for the first layer can be simultaneously performed, thereby being able to simplify steps of manufacturing the semiconductor device and making the positional relationship between the circuit pattern and the evaluation patterns always constant by forming both patterns at the same time.

In other words, in many cases, when the overlapping accuracy between the target layer and the processed layers is checked, one measurement mark (one near the center of the shot: subtotal 5 per shot) per side is arranged, and in the accuracy checking of each apparatus or the like, when two to three evaluation marks per side are arranged, they are only arranged on either X side or Y side. In contrast thereto, the objective of the present invention can be achieved by arranging two or more marks as close as to each corner of the four sides, in order to check that the first layer is overall ideal for improving the overlapping accuracy for the layers subsequent to the first layer based on the result of the exposure performed by the scanning-type reduced projection exposure apparatus which is used for the first layer.

As described above, using the scanning-type reduced projection exposure apparatus (scanner) 10, a number of types of accuracy checking (e.g., a stage-stepping accuracy in X direction and Y direction, a reticle rotation accuracy and etc.) for the first layer and/or a halfway layer of the second layer and its subsequent layers can be comprehensively and collectively performed by detecting and evaluating a printing misalignment between each step adjacent shot. Thus, steps for manufacturing a semiconductor device can be simplified and the position of the first layer and/or the halfway layer of the second layer and its subsequent layers for the subsequent second layer and/or the halfway layer of the second layer and its subsequent layers can be adjusted and controlled with excellent accuracy.

Furthermore, the result of alignment of the second layer and its subsequent layers can be improved. Additionally, when an exposure apparatus has some trouble, the operation of the exposure apparatus can be checked in unit of processed lot. Furthermore, it is possible to lengthen the time cycle of accuracy stability checking (PM) items which are used for evaluating an equivalent exposure operation with accuracy stability checking (PM) which is performed in order to check the positional accuracy of the exposure apparatus (the downtime of the apparatus is reduced and the uptime ratio of the apparatus is increased).

Additionally, in combination with each accuracy checking of the exposure apparatuses, in an exposure apparatus evaluation method according to the present invention, the original plate has a fixed value. Thus, there are cases in which each processed lot suggests a change of a variety of accuracy of the exposure apparatuses over time and unexpected fluctuation of the apparatuses. Therefore, it is possible to extend the time cycle of corresponding accuracy checking which is regularly performed on the single exposure apparatus.

Furthermore, by using a developed exposure apparatus, when a semiconductor device (exposure on a wafer substrate) is created, it is possible to find abnormality of the exposure apparatuses, deficiency of accuracy checking (initial accuracy setting) or slight change of accuracy over time.

Furthermore, when the first layer is exposed to light by using a scanner, condition of the apparatus can be checked in unit of lot. Correction on alignment for the second layer and its subsequent layers can be positively performed. For example, rather than making the first layer toward an ideal position, the first layer can be exposed to light with distortion so as to match the distortion of an exposure apparatus for the second layer and its subsequent layers.

Furthermore, a method for satisfying the objective (checking if a printing is performed at an ideal position) can be performed in unit of lot while all of the accuracy checks are included.

Furthermore, when the evaluation patterns 2a and 2b are arranged on two or more locations of each of the four sides of a printed shot, the amount of misalignment between the evaluation patterns is measured after the printing, and linear components are subtracted based on the measurement, then non-linear components in the printed shot can be checked. Thus, it is effective when a grouping with a full-field-type reduced projection exposure apparatus (stepper) is performed.

Figure 10:
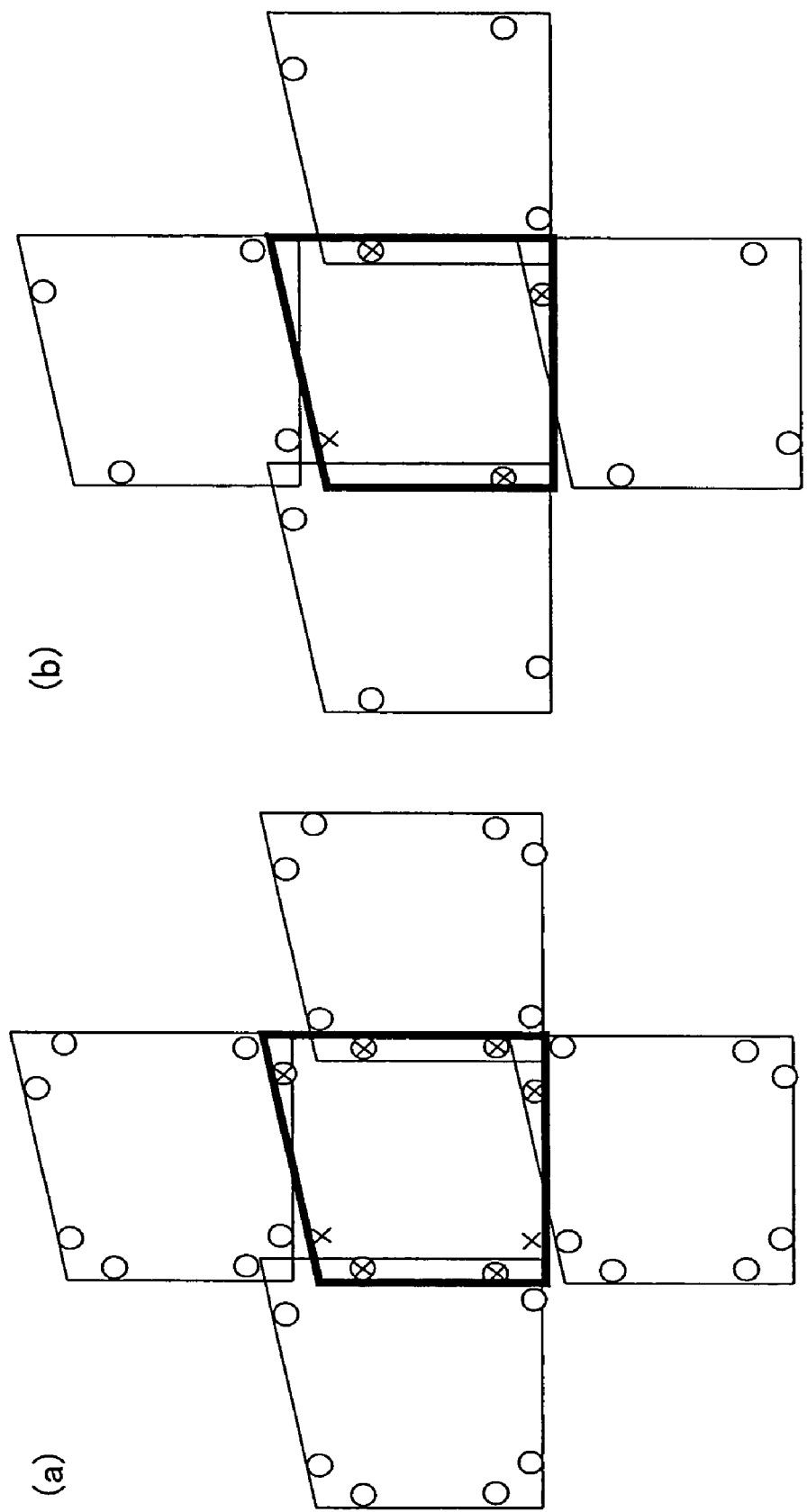
FIG. 10 is a schematic view showing an example of arrangement position of evaluation patterns of shots, which include non-linear components, according to the present invention.
Figure 11:
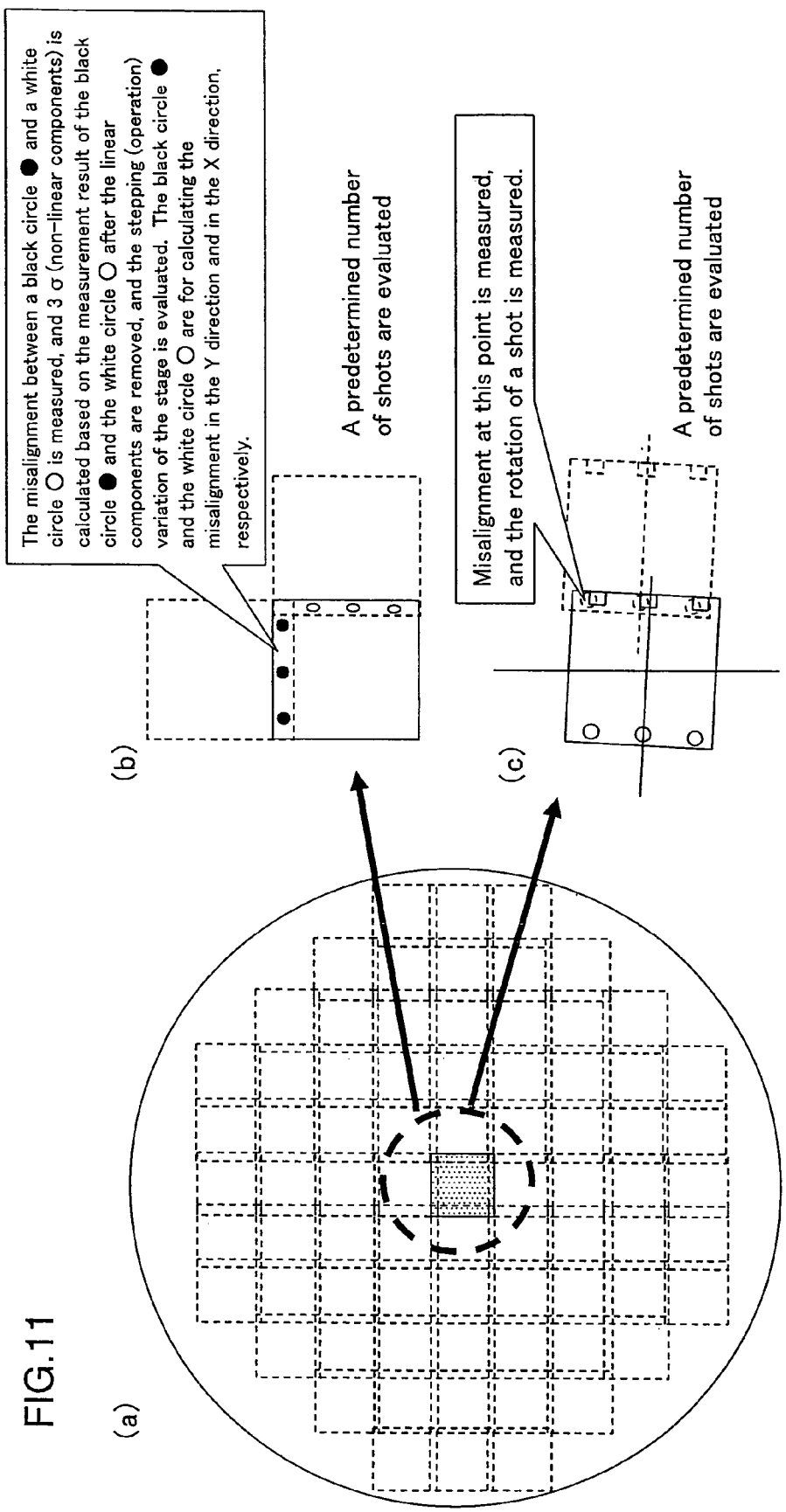
FIG. 11(a) is a view showing an example of a shot map on a wafer.
FIG. 11(b) is a view showing an arrangement of inspection marks for evaluating a stage-stepping accuracy and FIG. 11(c) is a view showing an arrangement of inspection marks for evaluating reticle rotation accuracy.

In the Embodiment described above, the case, in which two evaluation marks 2a and 2b are arranged on each of four sides on a printed area of the original plate (reticle R), has been described. However, the Embodiment is not limited to this. When three or more evaluation marks 2a and 2b are arranged on each side, each of the evaluation marks 2a and 2b being positioned on the outermost of the side, it is preferable to arrange the evaluation patterns 2a and 2b such that the distance between the two points (distance between the evaluations patterns 2a and 2b and the evaluation patterns 2a and 2b) is equal. Alternatively, when each one evaluation pattern 2a and 2b is arranged on each side, it is difficult to determine a non-linear state as shown in FIG. 10. Therefore, it is preferable to arrange two or more evaluation patterns 2a and 2b.

As described above, by arranging one evaluation shot, yet simple, it is possible to obtain linear components. Thus, it is effective to arrange one evaluation pattern when the overlapping area R1 with adjacent areas is small. However, in FIG. 10, when an evaluation pattern in a state having a non-linear component is printed on a substrate, the non-linear component of the evaluation shot cannot be accurately calculated if only one evaluation pattern is arranged on each side of the evaluation shot.

In the Embodiment described above, as a plurality of linear components, it is structured so as to calculate the substrate offset component, the substrate scaling component, the substrate rotation component, the orthogonal-degree component, the shot scaling component, the shot rotation component and the shot orthogonal-degree component. However, the present invention is not limited to this. As the plurality of linear components, it can be structured so as to calculate at least two linear components of the substrate offset component, the substrate scaling component, the substrate rotation component, the substrate orthogonal-degree component, the shot scaling component, the shot rotation substrate and the shot orthogonal-degree component.

Furthermore, in addition to the Embodiment described above, when a reference position for connecting shots by the step-movement is a position parallel to a long side of the overlapping area R1 and a center line of a short side of the overlapping area R1 and when evaluation patterns are arranged on a position line-symmetrical with respect to the center line, as shown in FIG. 9, one and the other of each evaluation patterns 2a and 2b of adjacent shots are arranged in the outer peripheral side area and the inner peripheral side area separated by the central line in the overlapping area R1, and the one and the other are alternately arranged in the longitudinal direction of the side for each side In other words, the one (evaluation pattern 2a) and the other (evaluation pattern 2b) of one evaluation pattern of each shot adjacent to each other are arranged in an outer peripheral side area and an inner peripheral side area of the overlapping area R1, respectively, and the other (evaluation pattern 2b) and the one (evaluation pattern 2a) of the other evaluation pattern of each shot adjacent to each other are arranged so as to correspond to the one (evaluation pattern 2a) and the other (evaluation pattern 2b) of the one evaluation pattern of each shot adjacent to each other. The one and the other of each evaluation pattern 2a and 2b of adjacent shots are a combination of figure patterns which are different from each other in shape and/or size. Alternatively, the one and the other of each evaluation pattern 2a and 2b of adjacent shots are a combination of figure patterns which are the same to each other in shape and/or size. Specifically, the evaluation pattern can be a figure pattern in a circular shape, a polygonal shape, a lattice-shape, a groove-shape or a combination thereof besides the evaluation patterns 2a and 2b. In this case, the evaluation pattern of one of the adjacent shots is a small figure pattern, the evaluation pattern of the other adjacent shot is a large figure pattern, and an allowable range can be set based on whether the small figure pattern is accommodated in the large figure pattern.

In a manufacturing method for semiconductor device for manufacturing a semiconductor device using an exposure operation evaluation method for an exposure apparatus according to the present invention described above, a semiconductor chip can be manufactured using the overlapping area R1 as an area for dicing between each semiconductor chip.

As described above, the present invention is exemplified by the use of its preferred Embodiment. However, the present invention should not be interpreted solely based on the Embodiment described above. It is understood that the scope of the present invention should be interpreted solely based on the claims. It is also understood that those skilled in the art can implement equivalent scope of technique, based on the description of the present invention and common knowledge from the description of the detailed preferred Embodiment of the present invention. Furthermore, it is understood that any patent, any patent application and any references cited in the present specification should be incorporated by reference in the present specification in the same manner as the contents are specifically described therein.

INDUSTRIAL APPLICABILITY

In the field of: an exposure operation evaluation method for an exposure apparatus for adjusting and controlling an exposure operation by measuring a printing result of a predetermined evaluation pattern which has been printed on a substrate by the exposure operation; and a manufacturing method for semiconductor device for manufacturing a semiconductor device by using the adjusted and controlled exposure apparatus based on the evaluation result obtained by the exposure operation evaluation method for the exposure apparatus, according to the present invention, a number of types of accuracy checking (e.g., a stage-stepping accuracy in X direction and Y direction, a reticle rotation accuracy and etc.) for the first layer can be comprehensively and collectively performed by detecting and evaluating a printing misalignment between each step adjacent shot. Thus, steps for manufacturing a semiconductor device can be simplified and the position of the first layer for a subsequent second layer can be adjusted and controlled with excellent accuracy.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An exposure operation evaluation method for an exposure apparatus for arranging a predetermined number of at least one evaluation pattern in an overlapping area and printing the at least one evaluation pattern on a substrate when performing a plurality of exposures and printing on the substrate while sequentially step-moving an exposure area in quadrangle, the exposure area having evaluation patterns arranged only on an outer peripheral side of a circuit pattern, the overlapping area overlapping respective exposure areas adjacent to four sides of the exposure area, the method comprising:

measuring a printing misalignment between each evaluation pattern of adjacent exposure areas printed on the substrate; and calculating a plurality of linear components in an exposure operation of the exposure apparatus based on the result of the measurement of the printing misalignment and suppressing and controlling the printing misalignment based on the plurality of linear components.

2. An exposure operation evaluation method for an exposure apparatus according to claim 1, wherein the number of the at least one evaluation pattern provided on each of four sides of the exposure area is one to eight.

3. An exposure operation evaluation method for an exposure apparatus according to claim 2, wherein the at least one evaluation pattern is at least provided on both end portions of the overlapping area on adjacent exposure areas in a longitudinal direction except an overlapping portion of the exposure areas in the diagonal direction.

4. An exposure operation evaluation method for an exposure apparatus according to claim 1, wherein the at least one evaluation pattern is at least provided on both end portions of the overlapping area on adjacent exposure areas in a longitudinal direction except an overlapping portion of the exposure areas in the diagonal direction.

5. An exposure operation evaluation method for an exposure apparatus according to claim 1, wherein the at least one evaluation pattern is provided on four corner portions of the exposure area.

6. An exposure operation evaluation method for an exposure apparatus according to claim 1, wherein a reference position for connecting the exposure areas by the step-movement is a position parallel to a long side of the overlapping area and a center line of a short side of the overlapping area.

7. An exposure operation evaluation method for an exposure apparatus according to claim 6, wherein the width of the overlapping area is greater than or equal to 50 μm and less than or equal to 100 μm.

8. An exposure operation evaluation method for an exposure apparatus according to claim 6, wherein the at least one evaluation pattern is arranged on the center line or a position line-symmetrical with respect to the center line.

9. An exposure operation evaluation method for an exposure apparatus according to claim 8, wherein one and the other of the at least one evaluation pattern of one of the adjacent exposure areas are arranged in an outer peripheral side area and an inner peripheral side area of the overlapping area, respectively, and the other and one of the at least one evaluation pattern of the other adjacent exposure area are arranged so as to correspond to the one and the other of the at least one evaluation pattern of the one of the adjacent exposure areas.

10. An exposure operation evaluation method for an exposure apparatus according to claim 1, wherein the width of the overlapping area is greater than or equal to 50 μm and less than or equal to 100 μm.

11. An exposure operation evaluation method for an exposure apparatus according to claim 1, wherein the at least one evaluation pattern is a figure pattern in a circular shape, a polygonal shape, a lattice-shape, a groove-shape or a combination thereof.

12. An exposure operation evaluation method for an exposure apparatus according to claim 11, wherein the at least one evaluation pattern of one of the adjacent exposure areas is a small figure pattern, the at least one evaluation pattern of the other adjacent exposure area is a large figure pattern, and an allowable range is set based on whether the small figure pattern is accommodated in the large figure pattern.

13. An exposure operation evaluation method for an exposure apparatus according to claim 1, wherein the at least one evaluation pattern of one of the adjacent exposure areas is a small figure pattern, the at least one evaluation pattern of the other adjacent exposure area is a large figure pattern, and an allowable range is set based on whether the small figure pattern is accommodated in the large figure pattern.

14. An exposure operation evaluation method for an exposure apparatus according to claim 1, wherein a printing target position of the exposure area formed on the substrate is set depending on a distortion of an exposure apparatus, the exposure apparatus being used for forming subsequent layers.

15. An exposure operation evaluation method for an exposure apparatus according to claim 1, wherein the measurement of the printing misalignment is performed in unit of lot.

16. An exposure operation evaluation method for an exposure apparatus according to claim 15, wherein the measurement of the printing misalignment is performed on a first layer and/or a halfway layer of a second layer and its subsequent layers on the substrate.

17. An exposure operation evaluation method for an exposure apparatus according to claim 1, wherein the measurement of the printing misalignment is performed on a first layer and/or a halfway layer of a second layer and its subsequent layers on the substrate.

18. An exposure operation evaluation method for an exposure apparatus according to claim 1, wherein the measurement of the printing misalignment is performed by measuring a printing misalignment between each evaluation pattern of the adjacent exposure areas by using an overlapping precision measurement device and calculating a plurality of linear components based on the measured printing misalignment, each evaluation pattern respectively being printed on arbitrary number of four to ten exposure areas on the substrate.

19. An exposure operation-evaluation method for an exposure apparatus according to claim 1, wherein the printing misalignment of the at least one evaluation pattern formed on the substrate is managed and corrected so as to make a shot result in an exposure step constant in a predetermined allowable range and stabilize overlapping accuracy in subsequent layers.

20. An exposure operation evaluation method for an exposure apparatus according to claim 1, wherein as the plurality of linear components, at least two linear components of a substrate offset component, a substrate scaling component, a substrate rotation component, a substrate orthogonal-degree component, a shot scaling component, shot rotation component and a shot orthogonal-degree component are calculated.

21. An exposure operation evaluation method for an exposure apparatus according to claim 20, wherein the exposure apparatus is a scanning-type reduced projection exposure apparatus, and the scanning-type reduced projection exposure apparatus is adjusted and controlled such that linear components relating to shot result in "0", the linear components uncorrectable by a full-field-type reduced projection exposure apparatus.

22. An exposure operation evaluation method for an exposure apparatus according to claim 1, wherein one and the other of the at least one evaluation pattern of one of the adjacent exposure areas are arranged in an outer peripheral side area and an inner peripheral side area of the overlapping area, respectively, and the other and one of the at least one evaluation pattern of the other adjacent exposure area are arranged so as to correspond to the one and the other of the at least one evaluation pattern of the one of the adjacent exposure areas.

23. An exposure operation evaluation method for an exposure apparatus according to claim 22, wherein the one and the other of the at least one evaluation pattern of the adjacent exposure area are a combination of figure patterns, the figure patterns being different from each other in shape and/or size.

24. An exposure operation evaluation method for an exposure apparatus according to claim 1, wherein the one and the other of the at least one evaluation pattern of the adjacent exposure area are a combination of figure patterns, the figure patterns being different from each other in shape and/or size.

25. An exposure operation evaluation method for an exposure apparatus according to claim 22, wherein the one and the other of the at least one evaluation pattern of the adjacent exposure area are a combination of figure patterns, the figure patterns being the same to each other in shape and/or size.

26. An exposure operation evaluation method for an exposure apparatus according to claim 1, wherein the one and the other of the at least one evaluation pattern of the adjacent exposure area are a combination of figure patterns, the figure patterns being the same to each other in shape and/or size.

27. An exposure operation evaluation method for an exposure apparatus according to claim 11, wherein the at least one evaluation pattern of one of the adjacent exposure areas is a small figure pattern, the at least one evaluation pattern of the other adjacent exposure area is a large figure pattern, and it is measured whether the errors of the central coordinates of the large figure pattern and the small figure pattern are within an allowable range.

28. An exposure operation evaluation method for an exposure apparatus according to claim 1, wherein the at least one evaluation pattern of one of the adjacent exposure areas is a small figure pattern, the at least one evaluation pattern of the other adjacent exposure area is a large figure pattern, and it is measured whether the errors of the central coordinates of the large figure pattern and the small figure pattern are within an allowable range.

29. A manufacturing method for semiconductor device for manufacturing a semiconductor device using an exposure operation evaluation method for an exposure apparatus according to claim 1.

30. A manufacturing method for semiconductor device according to claim 29, wherein a semiconductor chip is manufactured using the overlapping area as an area for dicing between each semiconductor chip.

* * * * *